(12) United States Patent
Shinozaki et al.

(10) Patent No.: US 9,666,469 B2
(45) Date of Patent: May 30, 2017

(54) LIFTING DEVICE, SUBSTRATE PROCESSING APPARATUS HAVING LIFTING DEVICE, AND UNIT TRANSFERRING METHOD

(71) Applicant: EBARA CORPORATION, Tokyo (JP)

(72) Inventors: Hiroyuki Shinozaki, Tokyo (JP); Kenji Shinkai, Tokyo (JP); Tadakazu Sone, Tokyo (JP); Hideo Aizawa, Tokyo (JP); Hiroshi Aono, Tokyo (JP); Toshio Yokoyama, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 192 days.

(21) Appl. No.: 14/494,038

(22) Filed: Sep. 23, 2014

(65) Prior Publication Data
US 2015/0082613 A1    Mar. 26, 2015

(30) Foreign Application Priority Data

Sep. 25, 2013  (JP) .................................. 2013-197742
Apr. 25, 2014  (JP) .................................. 2014-091507

(51) Int. Cl.
    *B24B 49/00*    (2012.01)
    *H01L 21/687*    (2006.01)
    *H01L 21/67*    (2006.01)

(52) U.S. Cl.
CPC .... *H01L 21/68742* (2013.01); *H01L 21/6719* (2013.01); *Y10T 29/49998* (2015.01)

(58) Field of Classification Search
CPC .... B24B 1/00; B24B 5/00; B24B 7/00; B24B 37/00
See application file for complete search history.

(56) References Cited

U.S. PATENT DOCUMENTS

| | | | | |
|---|---|---|---|---|
| 6,607,427 B2 * | 8/2003 | Togawa | ............... | B24B 53/017 451/443 |
| 6,910,943 B2 * | 6/2005 | Ishikawa | ................. | B24B 7/228 257/E21.23 |
| 6,921,317 B2 * | 7/2005 | Wood | ..................... | B24B 19/06 451/1 |
| 7,063,598 B2 * | 6/2006 | Isobe | .................... | B24B 37/345 451/285 |
| 7,097,534 B1 * | 8/2006 | Yampolskiy | ............ | B24B 49/02 451/28 |
| 7,214,124 B2 * | 5/2007 | Kobayashi | ............ | B24B 37/102 451/36 |
| 8,517,796 B2 * | 8/2013 | Shinozaki | ............... | B24B 49/08 451/443 |

FOREIGN PATENT DOCUMENTS

JP    08-243916 A    9/1996
JP    2012-209589 A    10/2012

* cited by examiner

*Primary Examiner* — Lee D Wilson
(74) *Attorney, Agent, or Firm* — Pearne & Gordon LLP

(57) ABSTRACT

A lifting device 630b includes a lifting mechanism 640 and an adjustment member 660. The lifting mechanism 640 is provided between at least one of a plurality of units of a substrate processing apparatus and an installation surface of the unit, and adjusts height of the at least one unit with respect to the installation surface. The adjustment member 660 is provided with an extended section 664 extended from the lifting mechanism 640, and is capable of operating the lifting mechanism 640 through the extended section 664.

12 Claims, 22 Drawing Sheets

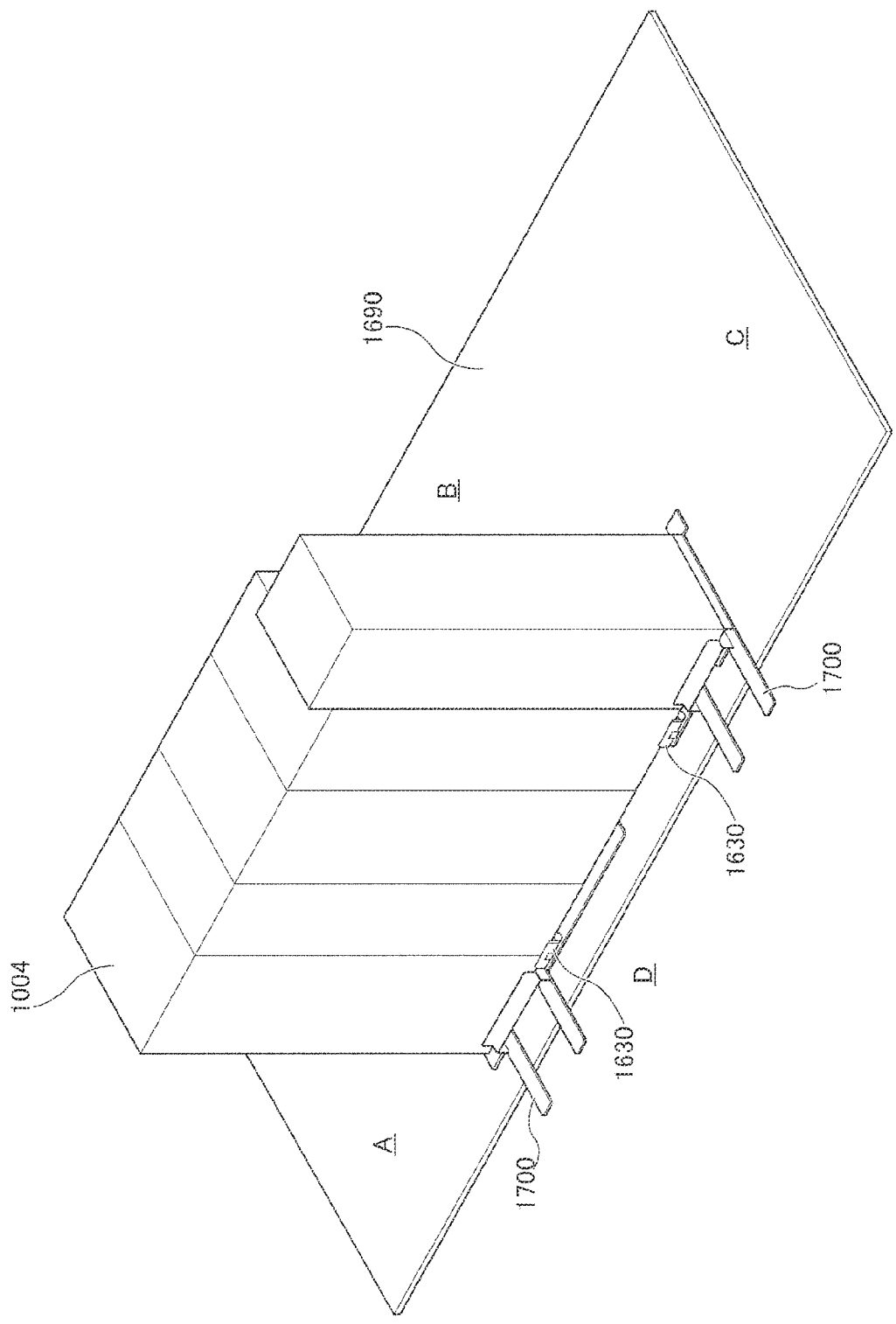

LIFTING DEVICE, SUBSTRATE PROCESSING APPARATUS HAVING LIFTING DEVICE, AND UNIT TRANSFERRING METHOD

CROSS-REFERENCE TO RELATED APPLICATION

This application is based upon and claims the benefit of priority of the prior Japanese Patent Application No. 2013-197742, filed on Sep. 25, 2013, and Japanese Patent Application No. 2014-091507, filed on Apr. 25, 2014, the entire contents of which are incorporated herein by reference.

TECHNICAL FIELD

The present invention relates to a lifting device, a substrate processing apparatus provided with the lifting device, and a method of conveying a unit.

BACKGROUND ART

In recent years, a substrate processing apparatus for polishing a surface of a substrate such as a semiconductor wafer has been used. The substrate processing apparatus is composed of a polishing unit for polishing a substrate, a cleaning unit for cleaning and drying a substrate, a loading and unloading unit for conveying a substrate, and the like, for example. The substrate processing apparatus feeds a substrate fed into the loading and unloading unit into the polishing unit to polish the substrate, for example. In addition, the substrate processing apparatus feeds the substrate after polishing to the cleaning unit to clean and dry the substrate. Further, the substrate processing apparatus ejects the substrate after finishing the drying from the loading and unloading unit to the outside of the substrate processing apparatus.

The substrate processing apparatus is divided into the plurality of units described above when delivered to an operation place such as a semiconductor plant. The substrate processing apparatus is installed by assembling the respective units after the units are delivered. The substrate processing apparatus is leveled when installed.

That is, the substrate processing apparatus is required to keep each of the units horizontally as well as to have an even height level for each of the units in order to apply various kinds of processing to a substrate. Thus, each of the plurality of units includes a lifting device (leveling device) between the units and a floor (installation surface of the units) to support self-weight of each of the units as well as to adjust height from the floor.

Usually, a plurality of lifting devices is provided in each of the units. The substrate processing apparatus is capable of leveling the unit by adjusting height of each of the lifting devices of the unit. In addition, the substrate processing apparatus is capable of adjusting a height level among respective units by adjusting height of each of the lifting devices of each of the units.

An adjuster foot provided with a screw structure in a vertical direction is generally used as the lifting device. In addition, a substrate processing apparatus provided with a vibration isolator, for example, sometimes adjusts a height level of units by allowing the units to be loaded on wedge-shaped lifting devices that are arranged on an installation surface in advance.

When maintenance of a unit of a substrate processing apparatus is performed, for example, it is difficult to perform the maintenance while a plurality of units is assembled. Thus, a unit of a maintenance object is removed from the substrate processing apparatus to perform the maintenance.

In conventional arts, it is known that, in order to remove a unit of a maintenance object from a substrate apparatus, the unit is extracted and conveyed by using a caster leg provided with a roller capable of rolling in an extracting direction of a unit, whose length is adjustable.

CITATION LIST

Patent Literature

[Patent Document 1] Japanese Patent Laid-Open No. 8-243916
[Patent Document 2] Japanese Patent Laid-Open No. 2012-209589

SUMMARY OF INVENTION

Technical Problem

Unfortunately, in the conventional arts, it is not considered that it becomes difficult to adjust the height level as the substrate processing apparatus is increased in size.

That is, operation of adjusting a height level of the substrate processing apparatus is required to adjust a height level among a plurality of units. Thus, the operation is generally performed in a state where the plurality of units is assembled. The operation of adjusting a height level is performed by an operator who accesses a lifting device from a maintenance place outside the substrate processing apparatus by turning a screw of the lifting device, for example.

Accordingly, the operator can easily accesses a lifting device positioned near the maintenance place, such as a lifting device supporting an outer periphery portion of the substrate processing apparatus, for example. On the other hand, the operator may have difficulty in accessing a lifting device positioned away from the maintenance place, such as lifting device supporting the inside of a unit. The difficulty in accessing a lifting device becomes noticeable as each of units increases in size to result in increasing size of the substrate processing apparatus.

Thus, in one aspect of the invention of the present application, a subject matter is to facilitate adjustment of a height level of a substrate processing apparatus regardless of size of the substrate processing apparatus.

In the conventional arts, a frame body of a unit is supported by fixing legs in a state where the unit is not extracted and conveyed. On the other hand, in the conventional arts, when the unit is extracted and conveyed, length of caster legs is adjusted so as to be longer than length of the fixing legs so that the frame body of the unit is supported by the caster legs. In addition, in the conventional arts, the unit is extracted and conveyed by rolling rollers with a ball screw mechanism in a state where the frame body is supported by the caster legs.

In the conventional arts, since the frame body of the unit is supported by the caster legs, length of the caster legs needs to be adjusted (adjustment of height of the unit). Thus, in the conventional arts, an operator turns a screw of each of the caster legs to adjust the length of the caster legs.

Since a caster leg supporting a position corresponding to an outer periphery portion of a substrate processing apparatus, for example, is positioned close to an operation place outside the substrate processing apparatus, an operator can easily access the caster leg. On the other hand, since a caster leg supporting a position corresponding to the inside of the substrate processing apparatus is positioned away from the operation place, the operator may have difficulty in accessing the caster leg. In particular, the difficulty in accessing a caster leg becomes noticeable as each of units increases in size to result in increasing size of the substrate processing apparatus.

Thus, in one aspect of the invention of the present application, a subject matter is to facilitate adjustment of height of each of units of a substrate processing apparatus.

Solution to Problem

One aspect of a lifting device of the invention of the present application is made in light of the above-mentioned matters, the lifting device including: a lifting mechanism that is provided between at least one of a plurality of units of a substrate processing apparatus and an installation surface of the unit, and that adjusts height of the at least one unit with respect to the installation surface; and an adjustment member that is provided with an extended section extended from the lifting mechanism, and that is capable of operating the lifting mechanism through the extended section.

In addition, the lifting mechanism further includes a level adjuster connected to the lifting mechanism, capable of adjusting height of the at least one unit with respect to the installation surface by driving the lifting mechanism, and the adjustment member can include level adjustment member having a connection section connected to the level adjuster, an extended section extended from the connection section, and an operation section provided in the extended section, the level adjustment member being capable of driving the lifting mechanism through the level adjuster by operating the operation section.

Further, the lifting mechanism includes: a first member and a second member that are stacked between the installation surface and the at least one unit, and each of which has a surface facing to each other so as not to be horizontal; and a third member provided between the first member and the second member so as to be wedge-shaped, and it is preferable that the level adjuster is capable of adjusting a distance between the first member and the second member by driving the third member to slide.

It is possible to further provide a guide member that includes a first guide member including: a first contact section that is brought into contact with a surface of the first member, facing to the installation surface; first extended sections that extend along respective side surfaces of the first member, opposite to each other, from the first contact section; and projected first locking sections formed in the respective first extended sections, and that also includes a second guide member including: a second contact section that is brought into contact with surface to the second member, facing to the unit; second extended sections that extend along respective side surfaces of the second member, opposite to each other, from the second contact section; and projected second locking sections formed in the respective second extended sections to be engaged with the respective first locking sections, the guide member regulating movement of the first and second members in a direction in which the first and second members are separated from each other by engaging the respective first locking sections and the respective second locking sections.

It is preferable that each of the plurality of units includes a unit body that applies processing to the substrate, and a base member on which the unit body is loaded, and that the lifting device is provided between the base member and the installation surface.

In one aspect of the lifting device, a plate for supporting a lower surface of the at least one unit may be further provided, and the lifting mechanism is provided between a floor surface on which the substrate processing apparatus is installed, and the plate so as to be able to adjust height of the at least one unit with respect to the floor surface, and the adjustment member includes an extended section extended from the lifting mechanism along the plate to be able to operate the lifting mechanism through the extended section.

In addition, in one aspect of the lifting device, a height adjuster provided in the lifting mechanism may be further provided, and the adjustment member includes: a connection section to which the height adjuster is connected; the extended section that extends from the connection section along the plate; and an operation section provided in the extended section, so that the lifting mechanism can be operated through the height adjuster by operating the operation section.

Further, in one aspect of the lifting device, the lifting mechanism is provided on the floor surface side in one end of the plate, the lifting device further comprising a height adjuster capable of adjusting height of the at least one unit with respect to the floor surface, the height adjuster being provided on the floor surface side in the other end of the plate, wherein the extended section extends from the connection section in a direction of the height adjuster.

Furthermore, in one aspect of the lifting device, the lifting mechanism may include: first and second members that are stacked between the floor surface and the plate, and each of which has a surface facing to each other so as not to be horizontal; and a third member provided between the first and second members so as to be wedge-shaped, and the height adjuster is capable of adjusting a distance between the first and second members by driving the third member to slide.

Further yet, in one aspect of the lifting device, the lifting device may be a fixture that lifts the at least one unit when the at least one unit is conveyed by using a dolly.

One aspect of the substrate processing apparatus of the invention of the present application includes any one of the lifting devices, and a unit provided on the lifting device, whose height with respect to an installation surface is adjusted by the lifting device.

In addition, it is preferable that the substrate processing apparatus includes a plurality of assembled units, and that a plurality of the lifting devices is provided for each of the plurality of units.

A method of conveying a unit of the invention of the present application includes the steps of: lifting at least one unit of a substrate processing apparatus formed by assembling a plurality of units by using any one of the lifting devices described above; inserting a dolly into a bottom space of the at least one unit after the step of lifting; lowering the at least one unit until the at least one unit is loaded on the dolly by using any one of the lifting devices after the step of inserting; and extracting and conveying the at least one unit loaded on the dolly by using the dolly.

Advantageous Effects of Invention

In accordance with one aspect of the invention of the present application, it is possible to easily adjust a height level regardless of size of a substrate processing apparatus.

In addition, in accordance with one aspect of the invention of the present application, it is possible to easily adjust height of units of a substrate processing apparatus.

BRIEF DESCRIPTION OF DRAWINGS

FIG. 13 schematically shows a state at the time of extracting and conveying a cleaning unit 1004;

DESCRIPTION OF EMBODIMENTS

Hereinafter, a lifting device and a substrate processing apparatus in accordance with one embodiment of the invention of the present application will be described on the basis of accompanying drawings. In the following embodiment, a Chemical Mechanical Polishing (CMP) device will be described as an example of the substrate processing apparatus, but the substrate processing apparatus is not limited to the CMP device. In the following embodiment, first a whole structure of the substrate processing apparatus will be described, after that the lifting device will be described.

(Configuration of the Substrate Processing Apparatus)

Figure 1:
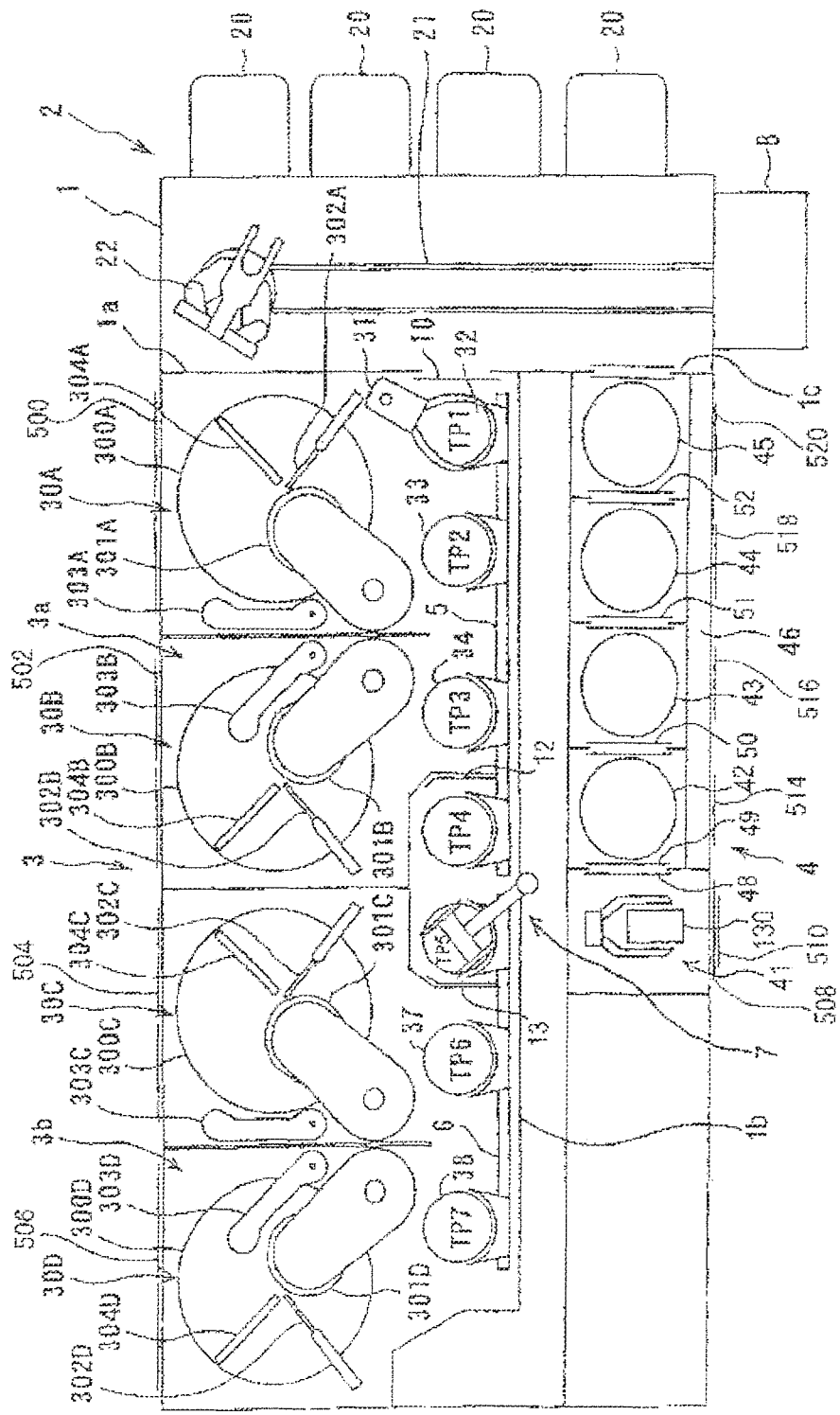
FIG. 1 is a plan view showing a whole structure of a substrate processing apparatus (polishing device) of a present embodiment.

FIG. 1 is a plan view showing a whole structure of the substrate processing apparatus (polishing device) in accordance with the present embodiment. As shown in FIG. 1, the polishing device of the present embodiment is provided with a substantially rectangular housing 1. The inside of the housing 1 has divisions for loading and an unloading unit 2, a polishing unit 3 (3a and 3b), and a cleaning unit 4 by partition walls 1a, 1b, and 1c. Each of the loading and unloading unit 2, the polishing unit 3 (3a and 3b), and the cleaning unit 4, is independently assembled, and is independently exhausted.

The loading and unloading unit 2 includes front loading units 20 on each of which two or more substrate cassettes for storing a large number of substrates (semiconductor wafers) are loaded (four in the present embodiment). The front loading units 20 are arranged adjacent to the polishing device in a width direction (a direction perpendicular to a longitudinal direction) of the polishing device. The front loading units 20 can be provided with an open cassette, a Standard Manufacturing Interface (SMIF) pod, a Front Opening Unified Pod (FOUP), or the like. The SMIF and the FOUP are closed containers that house substrate cassettes inside thereof, and are capable of maintaining environment independent of an outer space by being covered with partition walls.

The loading and unloading unit 2 is provided with a motion mechanism 21 along arrangement of the front loading units 20. On the motion mechanism 21, there is installed a conveyance robot 22 movable along an array direction of the substrate cassettes. The conveyance robot 22 is configured to move on the motion mechanism 21 so as to be able to access the substrate cassettes loaded in the front loading units 20. The conveyance robot 22 is provided with two hands up and down. Accordingly, the conveyance robot 22 is configured to use an upper hand when substrates are returned to the substrate cassettes, and to use a lower hand when substrates before polishing are conveyed, for example, so that the upper and lower hands can be properly used.

Since the loading and unloading unit 2 is required to be kept clean as much as possible, the inside of the loading and unloading unit 2 is constantly maintained at a pressure higher than a pressure in any of the outside of the apparatus, the polishing unit 3, and the cleaning unit 4. In addition, above the motion mechanism 21 of the conveyance robot 22, there is provided a filter fan unit (not shown) including a clean air filter such as a HEPA filter and an ULPA filter. The filter fan unit removes particles, and noxious fume and gas to make clean air so that the clean air is constantly jetted downward.

In the polishing unit 3, substrates are to be polished. The polishing unit 3 includes a first polishing unit 3a that is provided inside with a first polishing unit 30A and a second polishing unit 30B, and a second polishing unit 3b that is provided inside with a third polishing unit 30C and a fourth polishing unit 30D. As shown in FIG. 1, the first polishing unit 30A, second polishing unit 30B, third polishing unit 30C, and fourth polishing unit 30D, are arranged along the longitudinal direction of the apparatus.

As shown in FIG. 1, the first polishing unit 30A includes: a polishing table 300A provided with a polishing surface; a top ring 301A for polishing a substrate by pressing the substrate on the polishing table 300A while holding the substrate; an abrasive liquid supply nozzle 302A for supplying abrasive liquid and dressing liquid (such as water) to the polishing table 300A; a dresser 303A for dressing the polishing table 300A; and an atomizer 304A that turns mixed fluid of liquid (such as pure water) and gas (such as nitrogen), or liquid (such as pure water), into a spray to inject the spray on the polishing surface from one or more nozzles. Likewise, the second polishing unit 30B includes: a polishing table 300B, a top ring 301B, an abrasive liquid supply nozzle 302B, a dresser 303B, and an atomizer 304B. The third polishing unit 30C includes: a polishing table 300C; a top ring 301C; an abrasive liquid supply nozzle 302C; a dresser 303C; and an atomizer 304C. The fourth polishing unit 30D includes: a polishing table 300D; a top ring 301D; an abrasive liquid supply nozzle 302D; a dresser 303D; and an atomizer 304D.

There is arranged a first linear transporter 5 between the first polishing unit 30A and the second polishing unit 30B of the first polishing unit 3a, and the cleaning unit 4. The first linear transporter 5 conveys a substrate among four conveyance positions along the longitudinal direction (indicated as a first conveyance position TP1, a second conveyance position TP2, a third conveyance position TP3, and a fourth conveyance position TP4, in order from the loading and unloading unit 2). Above the first conveyance position TP1 of the first linear transporter 5, there is arranged a reversing machine 31 that reverses a substrate received from the conveyance robot 22 of the loading and unloading unit 2. Below the first conveyance position TP1, there is arranged a lifter 32 capable of lifting up and down. In addition, pushers 33 and 34 capable of lifting up and down are arranged below the second conveyance position TP2 and below the third conveyance position TP3, respectively. There is provided a shutter 12 between the third conveyance position TP3 and the fourth conveyance position TP4. Further, as shown in FIG. 1, there is provided a shutter 10 between the reversing machine 31 and the conveyance robot 22. At the time of conveying a substrate, the shutter 10 is opened to deliver the substrate between the conveyance robot 22 and the reversing machine 31.

In the second polishing unit 3b, a second linear transporter 6 is arranged adjacent to the first linear transporter 5. The second linear transporter 6 conveys a substrate among three conveyance positions along the longitudinal direction (indicated as a fifth conveyance position TP5, a sixth conveyance position TP6, and a seventh conveyance position TP7, in order from the loading and unloading unit 2). Pushers 37 and 38 are arranged below the sixth conveyance position TP6 and below the seventh conveyance position TP7 of the second linear transporter 6, respectively. In addition, there is provided a shutter 13 between the fifth conveyance position TP5 and the sixth conveyance position TP6.

Considering that abrasive liquid (slurry) is used at the time of polishing, it is perceived that the polishing unit 3 is the dirtiest region in the apparatus. Thus, in this example, the polishing unit 3 is exhausted from a periphery of each of the polishing tables in order to prevent particles in the polishing unit 3 from scattering outside. In addition, in order to prevent the particles from scattering, internal pressure of the polishing unit 3 is reduced with respect to pressure in the outside of the apparatus, the peripheral cleaning unit 4, and loading and unloading unit 2. There are usually provided an exhaust duct (not shown) below the polishing tables and a filter (not shown) above the polishing tables. Accordingly, air clarified through the exhaust duct and the filter is jetted to allow downflow to occur.

The respective polishing units 30A, 30B, 30C, and 30D are partitioned by partition walls to be sealed. The respective sealed polishing units 30A, 30B, 30C, and 30D are individually exhausted. Thus, substrates are treated in the sealed polishing units 30A, 30B, 30C, and 30D so as not to be affected by slurry in an atmosphere. As a result, favorable polishing can be achieved. As shown in FIG. 1, the partition walls among respective polishing units 30A, 30B, 30C, and 30D are provided with openings to allow the linear transporters 5 and 6 to pass therethrough. Each of the openings may be provided with a shutter to open the shutter only when a substrate passes through.

As shown in FIG. 1, there is provided an openable maintenance door 500 in an outer wall of a chamber that houses inside the polishing unit 30A so that the maintenance door 500 is capable of being locked at the time of a normal operation and being unlocked when abnormality is detected. The maintenance door 500 is configured so that the maintenance door 500 can be safely and easily opened and closed with an electromagnetic lock in which unlocking is operated in a screen of an operation panel. Likewise, there is provided an openable maintenance door 502 in an outer wall of a chamber that houses inside the polishing unit 30B. In addition, there is provided an openable maintenance door 504 in an outer wall of a chamber that houses inside the polishing unit 30C, as well as an openable maintenance door 506 in an outer wall of a chamber that houses inside the polishing unit 30D.

The cleaning unit 4 cleans a substrate after polishing. The cleaning unit 4 includes: a reversing machine 41 for reversing a substrate; a temporary storage table 130 for temporarily storing a substrate; four cleaning machines 42 to 45 for cleaning a substrate after polishing; and a conveyance unit 46 for conveying a substrate between the reversing machine 41 and the cleaning machines 42 to 45. The reversing machine 41 and the cleaning machines 42 to 45 are arranged along the longitudinal direction in a row. In addition, above the cleaning machines 42 to 45, a filter fan unit (not shown) with a clean air filter is provided. The filter fan unit removes particles to make clean air so that the clean air is constantly jetted downward. In addition, the inside of the cleaning unit 4 is constantly maintained at a pressure higher than a pressure in the polishing unit 3 in order to prevent particles from entering the cleaning unit 4 from the polishing unit 3.

The reversing machine 41 and the cleaning machines 42 to 45 are housed in chambers defined by openable shutters 48, 49, 50, 51, and 52, respectively, so that working fluid is prevented from scattering to the outside during cleaning.

There is provided an openable maintenance door 508 in an outer wall of a chamber that houses inside the reversing machine 41, and the maintenance door 508 is locked at the time of a normal operation and unlocked after abnormality is detected to be opened and closed so that an operator can enter and leave. As with the maintenance door described above, the maintenance door 508 is also configured so that the maintenance door 508 can be safely and easily opened and closed with an electromagnetic lock in which unlocking is operated in a screen of an operation panel.

In addition, in the maintenance door 508 provided in the outer wall of the chamber that houses inside the reversing machine 41, there is provided an openable substrate taking-in-and-out door 510 that allows a substrate to be taken in and out by hand without opening the maintenance door 508. In an outer wall of a chamber that houses inside a first cleaning machine 42 of the cleaning unit 4 of the polishing device, there is provided an openable substrate taking-in-and-out door 514 that is approximately the same size as the substrate taking-in-and-out door 510. In an outer wall of a chamber that houses inside a second cleaning machine 43 of the cleaning unit 4, there is provided a substrate taking-in-and-out door 516. In an outer wall of a chamber that houses inside a third cleaning machine 44 of the cleaning unit 4, there is also provided a substrate taking-in-and-out door 518, as well as in an outer wall of a chamber that houses inside a fourth cleaning machine 45 of the cleaning unit 4, there is provided a substrate taking-in-and-out door 520.

As shown in FIG. 1, a swing transporter (substrate conveyance mechanism) 7 is arranged between the first linear transporter 5 and the second linear transporter 6. The swing transporter (substrate conveyance mechanism) 7 conveys a substrate among the first linear transporter 5, the second linear transporter 6, and the reversing machine 41 of the cleaning unit 4. The swing transporter 7 is configured so as to be able to convey a substrate from the fourth conveyance position TP4 of the first linear transporter 5 to the fifth conveyance position TP5 of the second linear transporter 6. The swing transporter 7 is also configured so as to be able to convey a substrate from the fifth conveyance position TP5 of the second linear transporter 6 to the reversing machine 41, as well as to convey a substrate from the fourth conveyance position TP4 of the first linear transporter 5 to the reversing machine 41.

Between an opening of each of substrate cassettes loaded in the front loading units 20 and the apparatus, there is arranged a shutter (not shown) that is driven up and down by a cylinder, and that blocks a cassette loaded area from the inside of the apparatus. The shutter is closed with respect to each of the substrate cassettes unless the conveyance robot 22 takes in and out a substrate.

As shown in FIG. 1, the loading and unloading unit 2 is provided in its side portion with a film thickness measuring instrument (In-line Thickness Monitor: ITM) 8 for measuring a film thickness of a substrate. The conveyance robot 22 is configured to be able to access also the film thickness measuring instrument 8. The film thickness measuring instrument 8 receives a substrate before or after polishing from the conveyance robot 22 to measure a film thickness of the substrate. Thus, it is possible to improve polishing accuracy if polishing conditions, and the like are properly adjusted on the basis of a measurement result obtained by the film thickness measuring instrument 8.

First Embodiment of the Lifting Device

Next, a first embodiment of the lifting device will be described. As described above, the substrate processing apparatus includes the loading and unloading unit 2, the polishing unit 3a, the polishing unit 3b, and the cleaning unit 4. Each of the four units is independently manufactured, and is transported to an installation place (operation place) of the substrate processing apparatus. The substrate processing apparatus is installed by assembling the transported four units. The substrate processing apparatus is leveled when installed.

That is, each of the loading and unloading unit 2, the polishing unit 3a, the polishing unit 3b, and the cleaning unit 4 is required to stay horizontal in order to properly apply processing to a substrate. In addition, since the loading and unloading unit 2, the polishing unit 3a, the polishing unit 3b, and the cleaning unit 4 mutually deliver a substrate, the respective units are required to have the same height level to each other. Thus, each of the loading and unloading unit 2, the polishing unit 3a, the polishing unit 3b, and the cleaning unit 4, includes a lifting device (leveling device) between the units and a floor (installation surface of the units) to support self-weight of each of the units as well as to adjust height from the floor.

Figure 2:
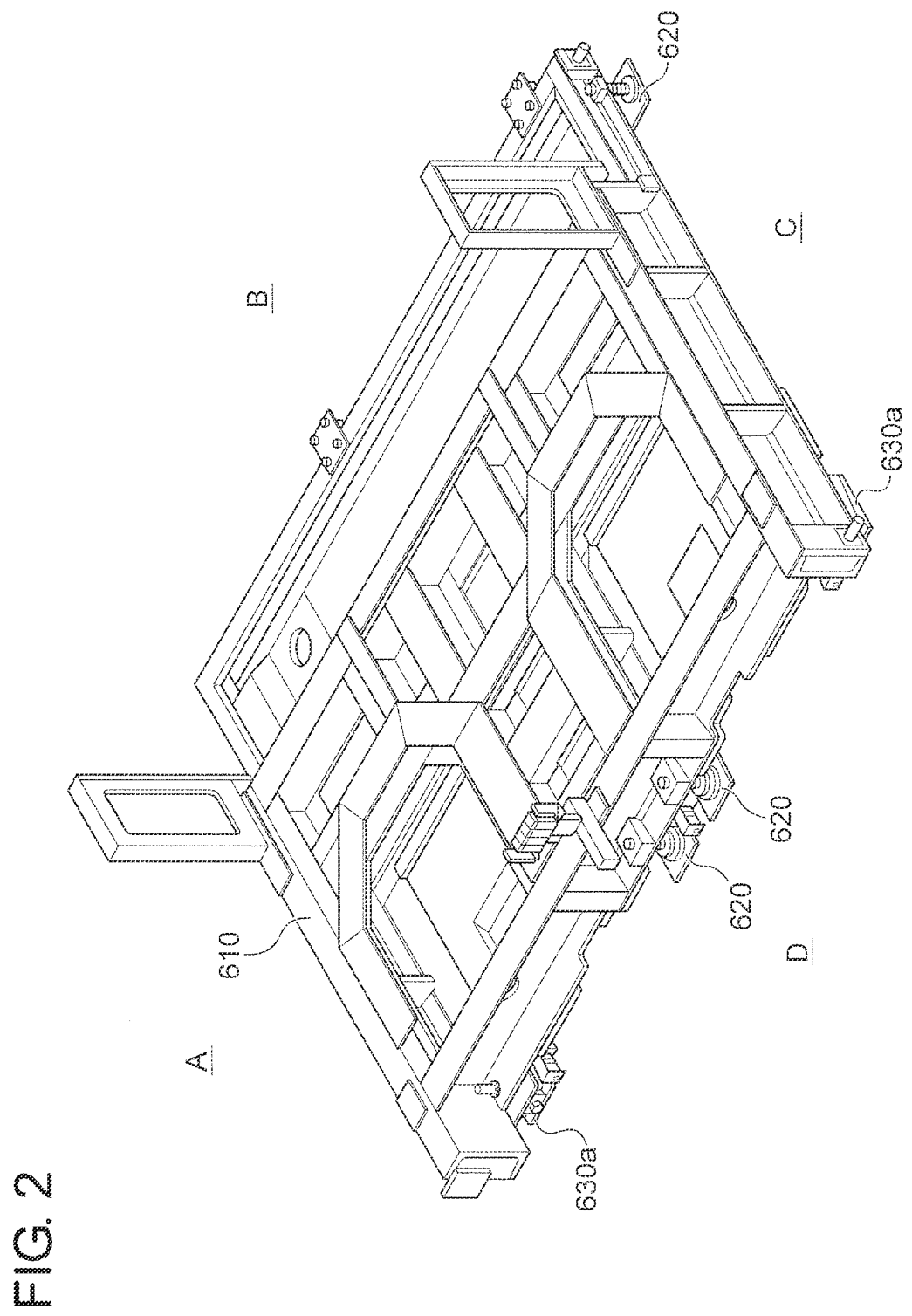
FIG. 2 is a perspective view of a base member of a polishing unit and a lifting device viewed obliquely from above.
Figure 3:
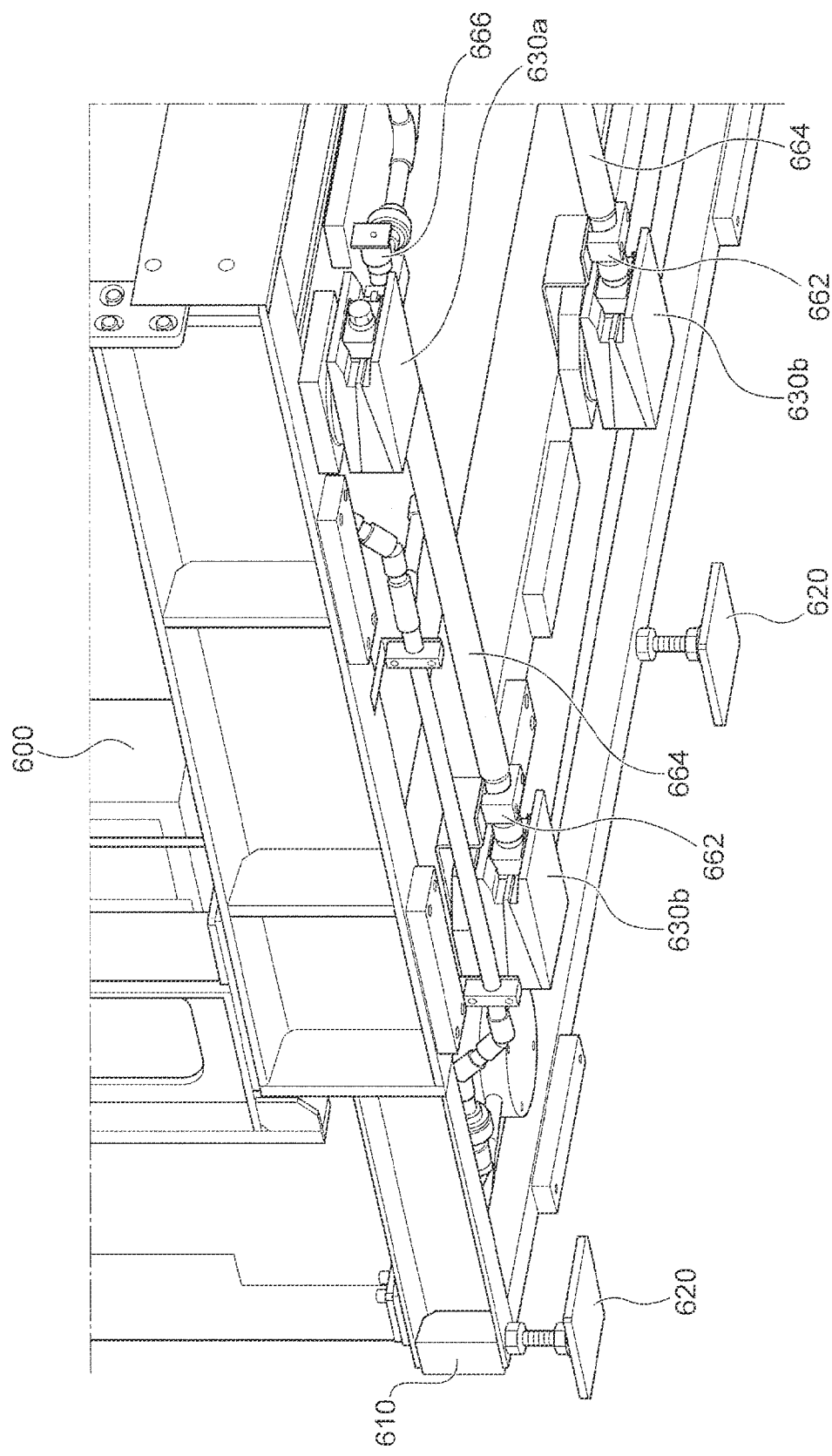
FIG. 3 is a perspective view of the base member of the polishing unit and the lifting device viewed obliquely from below.

Hereinafter, a lifting device for the polishing unit 3a will be described as a representative of the four units. FIG. 2 is a perspective view of a base member of a polishing unit and a lifting device viewed obliquely from above, and FIG. 3 is a perspective view of a base member of a polishing unit and a lifting device viewed obliquely from below. As with the polishing unit 3a, each of the loading and unloading unit 2, the polishing unit 3b, and the cleaning unit 4 is also provided with a lifting device.

The polishing unit 3a is provided with a base member (base) 610 on which a unit body 600 (FIG. 3) is loaded. The unit body 600 includes various kinds of processing sections, such as the polishing tables 300A and 300B, the top rings 301A and 301B, the abrasive liquid supply nozzles 302A and 302B, the dressers 303A and 303B, and the atomizers 304A and 304B, described above. In FIG. 2, the unit body 600 is not shown.

As shown in FIGS. 2 and 3, in the present embodiment, there is provided a plurality of lifting devices 630 between the base member 610 and an installation surface of the polishing unit 3a. Each of the lifting devices 630 is provided at a portion of the polishing unit 3a to which a large load (weight) is applied. There can be provided a lifting device 620 of an adjuster foot type with a screw structure in a vertical direction, at a place of the polishing unit 3a to which a light load is applied, and at a portion that does not affect leveling of the polishing unit 3a.

The lifting devices 630 include a lifting device 630a positioned at a place close to a maintenance place where an operator performs leveling operation, and a lifting device 630b positioned away from the maintenance place.

Figure 4:
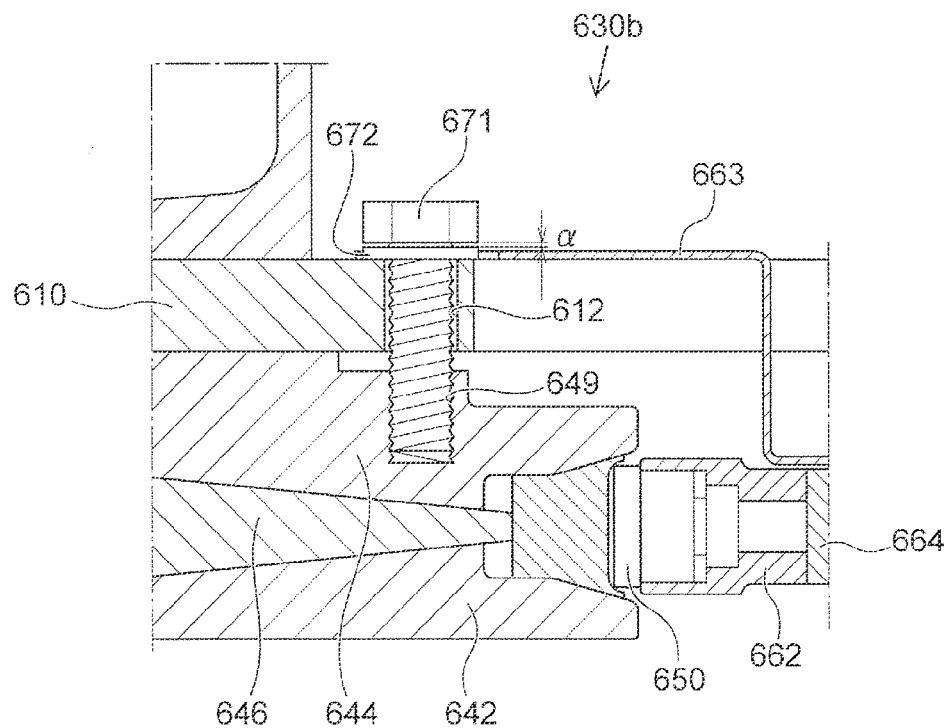
FIG. 4 is a sectional view showing a state where a lifting device 630b is connected to a base member 610.
Figure 5:
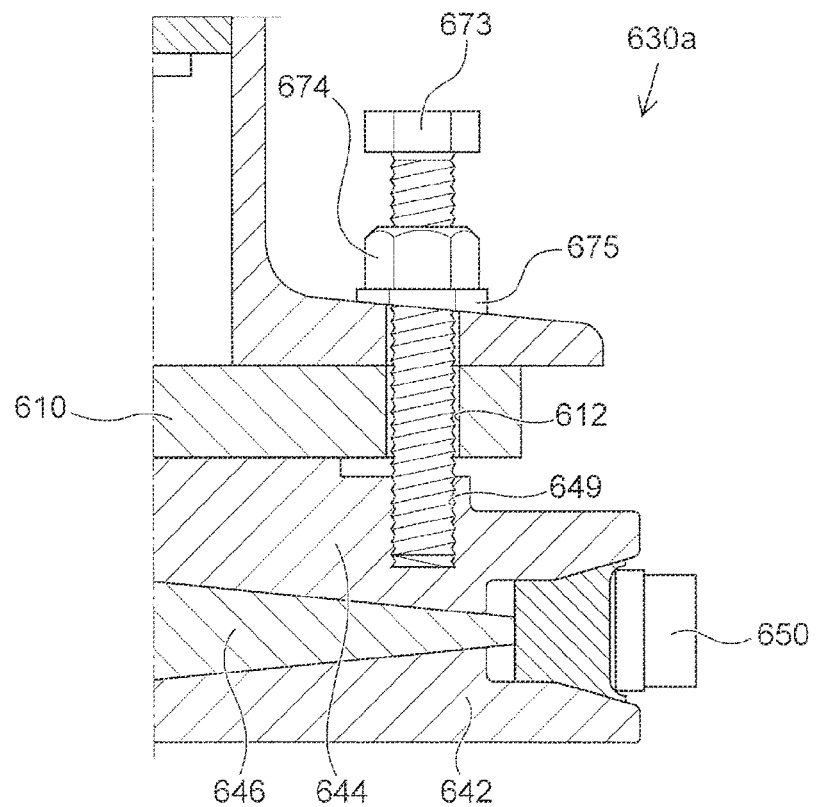
FIG. 5 is a sectional view showing a state where a lifting device 630a is connected to the base member 610.

Each of the lifting device 630a and the lifting device 630b is connected to the base member 610. FIG. 4 is a sectional view showing a state where the lifting device 630b is connected to the base member 610. FIG. 5 is a sectional view showing a state where the lifting device 630a is connected to the base member 610.

As shown in FIG. 4, the lifting device 630b is fixed to the base member 610 by screwing a bolt 671 into a hole 649 formed in the lifting device 630b through a washer 672 and a through-hole 612 formed in a base member 610. In addition, as shown in FIG. 5, the lifting device 630a is fixed to the base member 610 by screwing a bolt 673 into the hole 649 through a nut 674, a washer 675, and the through-hole 612.

The loading and unloading unit 2 is to be installed adjacent to the polishing unit 3a in an area A in FIG. 2, and in an area B, the cleaning unit 4 is to be installed adjacent to the polishing unit 3a, and also in an area C, the polishing unit 3b is to be installed adjacent to the polishing unit 3a. Thus, a maintenance place for leveling the polishing unit 3a is an area D. As a result, an operator can easily access (reach) the lifting device 630a positioned close to the maintenance place in the area D, but cannot easily access (reach) the lifting device 630b positioned away from the maintenance place in the area D. Difficulty in accessing the lifting device 630b becomes noticeable as the polishing unit 3a increases in size to result in increasing size of the substrate processing apparatus.

Figure 6:
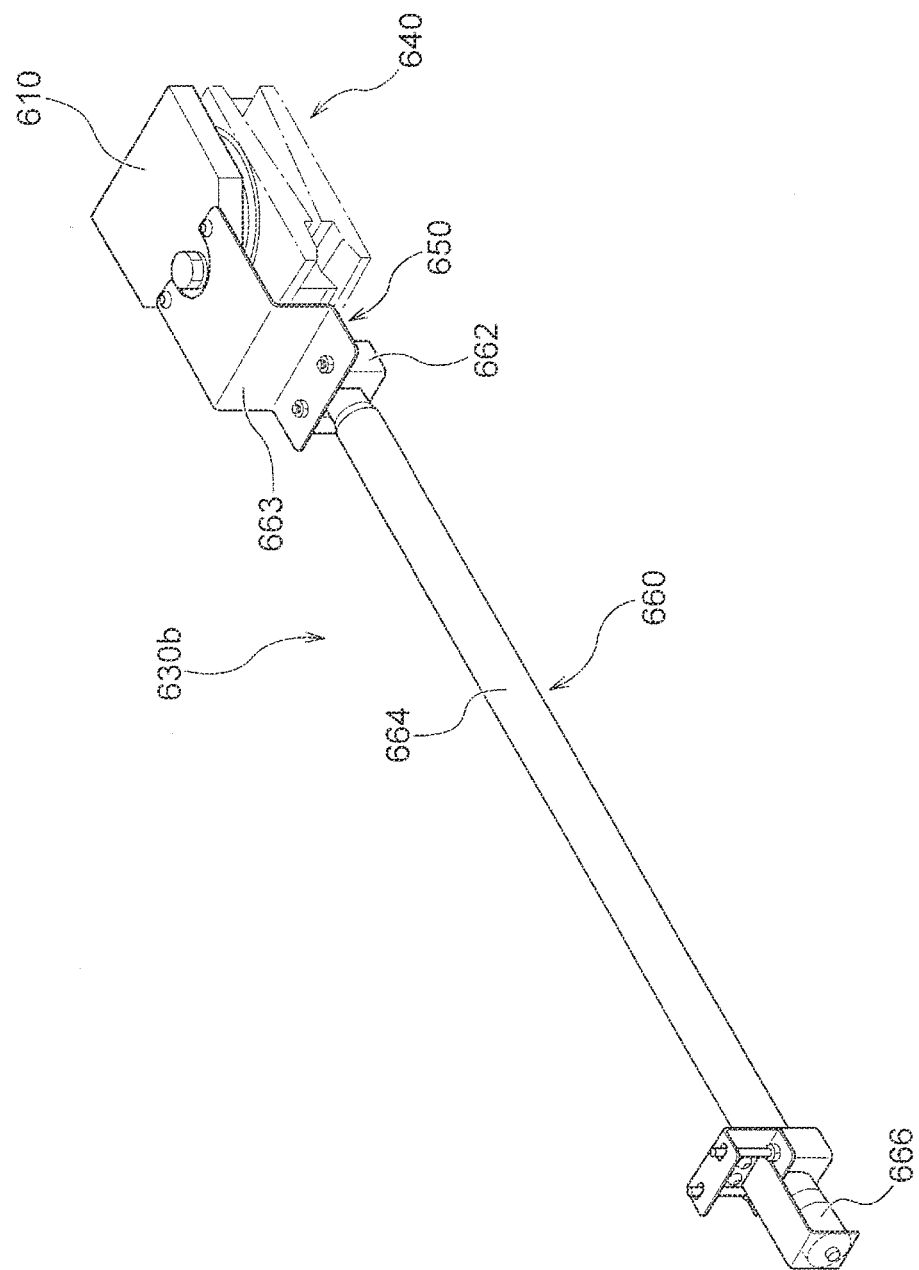
FIG. 6 shows a structure of the lifting device 630b of the present embodiment.
Figure 7:
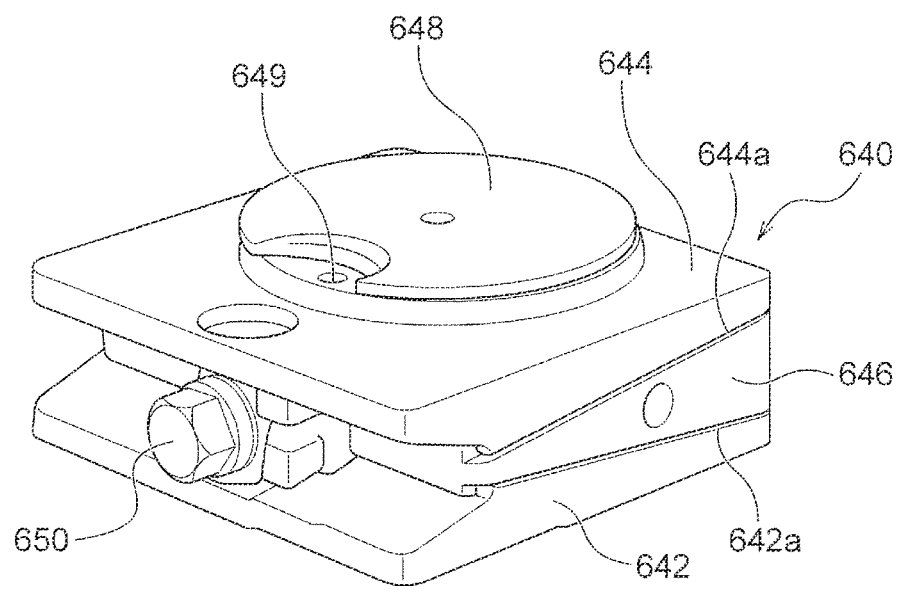
FIG. 7 shows a structure of the lifting device 630b of the present embodiment.

The present embodiment realizes a lifting device 630b accessible even if positioned away from a maintenance place. Hereinafter, the lifting device 630b will be described. FIGS. 6 and 7 show a structure of the lifting device 630b of the present embodiment. FIG. 8 is an illustration of operation of the lifting device 630b of the present embodiment. The lifting device 630a has a structure that is the same as that of the lifting device 630b shown in FIGS. 6 and 7.

As shown in FIGS. 6 to 8, the lifting device 630b includes: a lifting mechanism 640 for adjusting height of the polishing unit 3a with respect to an installation surface 690; a level adjustment knob (a level adjuster) 650 connected to the lifting mechanism 640; and a level adjustment member 660 connected to the level adjustment knob 650.

The lifting mechanism 640 includes a first member 642 and a second member 644, stacked between the installation surface 690 and the polishing unit 3a. The first member 642 and the second member 644 are provided with surfaces 642a and 644a facing to each other, respectively, the surfaces being formed so as not to be horizontal to each other. The surfaces 642a and 644a facing to each other are formed so as to be a wedge shape in a side view. In addition, the lifting mechanism 640 includes a third member 646 provided between the first member 642 and the second member 644 so as to be a wedge shape. Further, the lifting mechanism 640 includes a fourth member 648 of an approximate circular shape, provided above the first member 642. The second member 644 is provided with the hole 649 through which a bolt for fixing the lifting device 630b to the base member 610 penetrates.

The level adjustment knob 650 is a member capable of adjusting height of the polishing unit 3a with respect to the installation surface 690 by driving the lifting mechanism 640 (third member 646). Specifically, turning the level adjustment knob 650 allows a bolt that is not shown, interlocked with the level adjustment knob 650, to be turned to drive the third member 646 to slide.

The level adjustment member 660 includes: a connection section 662 connected to the level adjustment knob 650; a rod-like extended section (rod) 664 extending from the connection section 662; and an operation section 666 provided in the extended section 664. In the present embodiment, the connection section 662 is provided at a first end of the extended section 664, and the operation section 666 is provided at a second end of the extended section 664, but the configuration is not limited to the above. The connection section 662 is connected to the base member 610 through a connection member 663.

The level adjustment member 660 is configured to be able to drive the lifting mechanism 640 (third member 646) through the level adjustment knob 650 by operating the operation section 666. Specifically, an operator inserts a tool into the operation section 666 to turn the operation section 666 around an axis in an extending direction of the extended section 664, by using the tool. Accordingly, the extended section 664 turns, and the connection section 662 and the level adjustment knob 650 turn in conjunction with the extended section. In the present embodiment, there is shown an example in which an operator inserts a tool into the operation section 666 to turn the level adjustment knob 650 by using the tool, but an example is not limited to the above. It is also possible that an operator turns the operation section 666 by using an electric tool or the like.

Figure 8A:
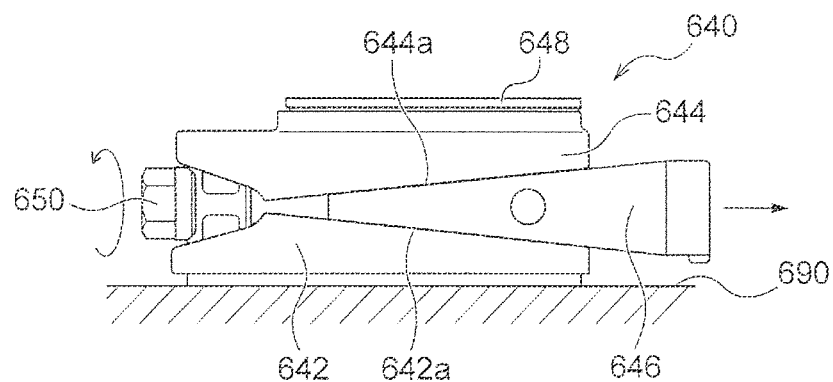
FIG. 8A is an illustration of operation of the lifting device 630b of the present embodiment.

For example, as shown in FIG. 8A, when the level adjustment knob 650 is turned in one direction (counterclockwise, for example) through the level adjustment member 660, the third member 646 is driven to slide away from the level adjustment knob 650. When the third member 646 is driven to slide away from the level adjustment knob 650, the second member 644 moves toward the installation surface 690 so that the first member 642 and the second member 644 are relatively close to each other.

Figure 8B:
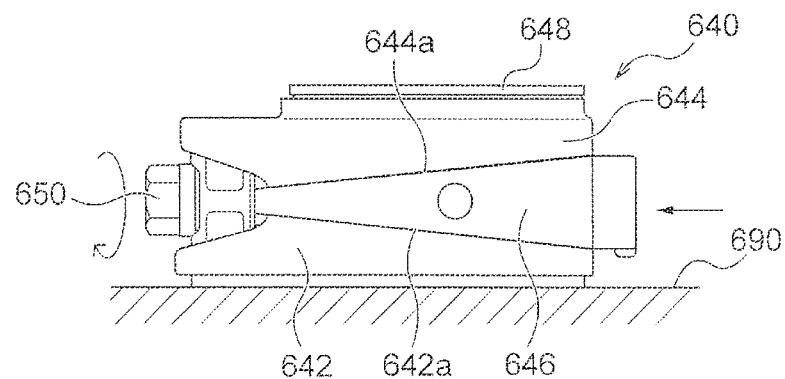
FIG. 8B is an illustration of operation of the lifting device 630b of the present embodiment.

On the other hand, as shown in FIG. 8B, when the level adjustment knob 650 is turned in an opposite direction (clockwise, for example) through the level adjustment member 660, the third member 646 is driven to slide close to the level adjustment knob 650. When the third member 646 is driven to slide close to the level adjustment knob 650, the second member 644 moves away from the installation surface 690 so that the first member 642 and the second member 644 are relatively away from each other.

Figure 8C:
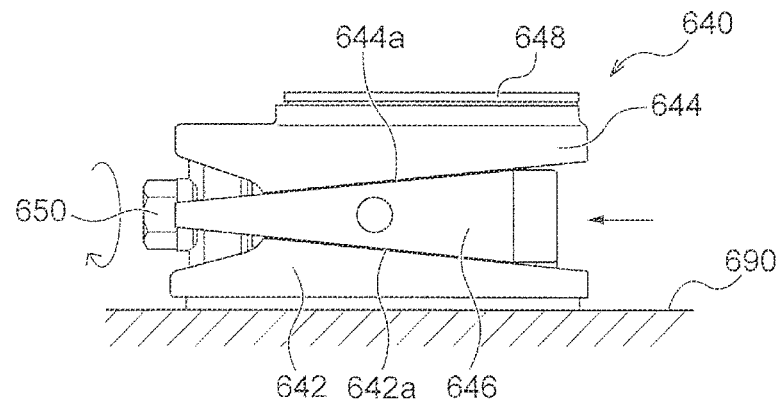
FIG. 8C is an illustration of operation of the lifting device 630b of the present embodiment.

In addition, as shown in FIG. 8C, when the level adjustment knob 650 is turned in a direction as with FIG. 8B (clockwise, for example) through the level adjustment member 660, the third member 646 is driven to slide close to the level adjustment knob 650. When the third member 646 is driven to slide close to the level adjustment knob 650, the second member 644 moves further away from the installation surface 690 so that the first member 642 and the second member 644 are further relatively away from each other.

In accordance with the present embodiment, since the level adjustment member 660 is provided, the operation section 666 for driving the lifting mechanism 640 (third member 646) is positioned in a maintenance place, or close to the maintenance place. Accordingly, an operator can easily access even the lifting device 630b positioned away from the maintenance place. As a result, in accordance with the present embodiment, it is possible to easily adjust a height level of the polishing unit 3a (adjustment of a horizontal level) regardless of size of a substrate processing apparatus. In addition, it is also possible to easily adjust a height level (adjustment of a horizontal level) of each of the loading and unloading unit 2, the polishing unit 3b, and the cleaning unit 4, as with the polishing unit 3a.

Second Embodiment

Next, a lifting device of a second embodiment will be described. The lifting device of the second embodiment is provided with a guide member for preventing a lifting device from separating from a unit when the lifting device is conveyed in a state where the lifting device is connected to the unit, in addition to the structure of the lifting device of the first embodiment. Detailed descriptions of structures as with the first embodiment are omitted.

In general, wedge-shaped lifting devices are arranged on an installation surface in advance so that a unit is loaded on the wedge-shaped lifting devices arranged on the installation surface to adjust a height level of the unit.

That is, as described above, the wedge-shaped lifting device 630 is composed by stacking a plurality of members, such as the first member 642, the second member 644, and the third member 646 (and fourth member 648). If the polishing unit 3a is lifted and conveyed in a state where the lifting device 630 as above is connected to the base member 610, the plurality of members of the lifting device 630 may be separated from each other, or partially separated from each other. If the plurality of members of the lifting device 630 is partially separated, the plurality of members may be incorrectly engaged with each other when placed on the installation surface 690. In addition, as shown in FIG. 4, for example, if a bolt is fastened with Locktite by setting a clearance a (such as about 1 mm) between a bolt head and a washer, the lifting device 630 comes down by the clearance to become in a state of hanging when a unit is conveyed. As a result, the lifting device 630 itself may turn at the time of assembly.

Figure 9:
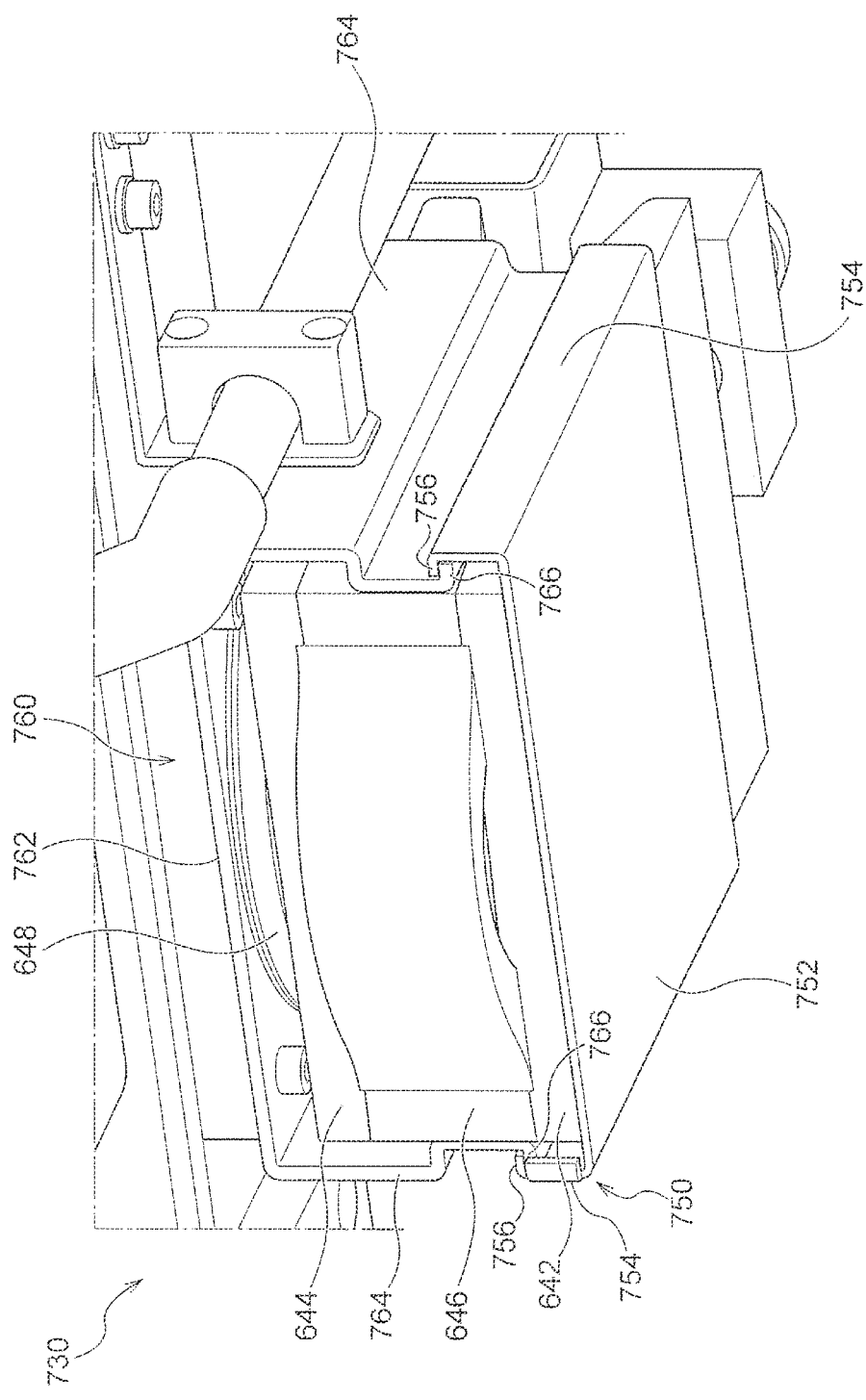
FIG. 9 shows a structure of a lifting device of a second embodiment.

In contrast, the lifting device of the second embodiment includes a guide member for preventing a plurality of members of the lifting device from separating from each other at the time of conveyance. FIG. 9 shows a structure of the lifting device of the second embodiment.

As shown in FIG. 9, a lifting device 730 includes a guide member 740 that prevents the first member 642 and the second member 644 from moving away from each other. The guide member 740 includes a first guide member 750 and a second guide member 760.

The first guide member 750 includes: a plate-shaped first contact section 752 that is brought into contact with a surface (a bottom surface of the first member 642) of the first member 642, facing to the installation surface 690; first extended sections 754 that extend along respective side surfaces of the first member 642, opposite to each other, from the first contact section 752; and projected first locking sections 756 formed in the respective first extended sections 754. Specifically, the first locking sections 756 project from respective ends of the first extended sections 754 toward the third member 646.

The second guide member 760 includes: a plate-shaped second contact section 762 that is brought into contact with a surface (a top surface of the second member 644) of the second member 644, facing to the polishing unit 3a; second extended sections 764 that extend along respective side surfaces of the second member 644, opposite to each other, from the second contact section 762; and projected second locking sections 766 that are formed in the respective second extended sections 764, and that are engaged with the respective first locking sections 756. Specifically, the second extended sections 764 extend along the respective side surfaces of the second members 644, and then bend toward the third member 646 to extend along the respective side surfaces of the second members 644 again. The second locking sections 766 project from respective ends of the second extended sections 764 in a direction away from the third member 646.

The first locking sections 756 and the second locking sections 766 are engaged with each other to prevent the first member 642 and the second member 644 from moving away from each other. Thus, in accordance with the present embodiment, even if the polishing unit 3a is conveyed in a state where the lifting device 730 is connected to the base member 610, it is possible to prevent the plurality of members (such as the first member 642, the second member 644, and the third member 646) of the lifting device 730 from separating from each other.

The guide member 740 prevents the first member 642 and the second member 644 from moving away from each other, but does not prevent the first member 642 and the second member 644 from moving close to each other. For example, as shown in FIG. 9, in a state where the first locking sections 756 and the second locking sections 766 are engaged with each other, when the level adjustment knob 650 is turned as shown in FIG. 8A, the second member 644 moves toward the installation surface 690 so that the first member 642 and the second member 644 are relatively close to each other. In addition, in a state where the first member 642 and the second member 644 are relatively close to each other, when the level adjustment knob 650 is turned as shown in FIG. 8B, the second member 644 moves away from the installation surface 690 until the first locking sections 756 and the second locking sections 766 are engaged with each other so that the first member 642 and the second member 644 are relatively away from each other. Thus, it is possible to level the polishing unit 3a, and to adjust height among respective units. In addition, in the second embodiment, it is possible to connect the lifting device 730 to the base member 610 with a stud bolt and a double nut, instead of the bolt 671 as shown in FIG. 4.

Next, a lifting device and a method of conveying a unit, in accordance with another embodiment of the invention of the present application will be described on the basis of accompanying drawings. Hereinafter, a CMP device will be described as an example of a substrate processing apparatus, but the substrate processing apparatus is not limited to the CMP device. In addition, hereinafter, there will be described a substrate processing apparatus including: a loading and unloading unit 1002; a polishing unit 1003; a cleaning unit 1004; and a control unit 1005, but the substrate processing apparatus is not limited to the above.

First, a structure of the CMP device will be described, after that the lifting device and the method of conveying a unit will be described.

(Substrate Processing Apparatus)

Figure 10:
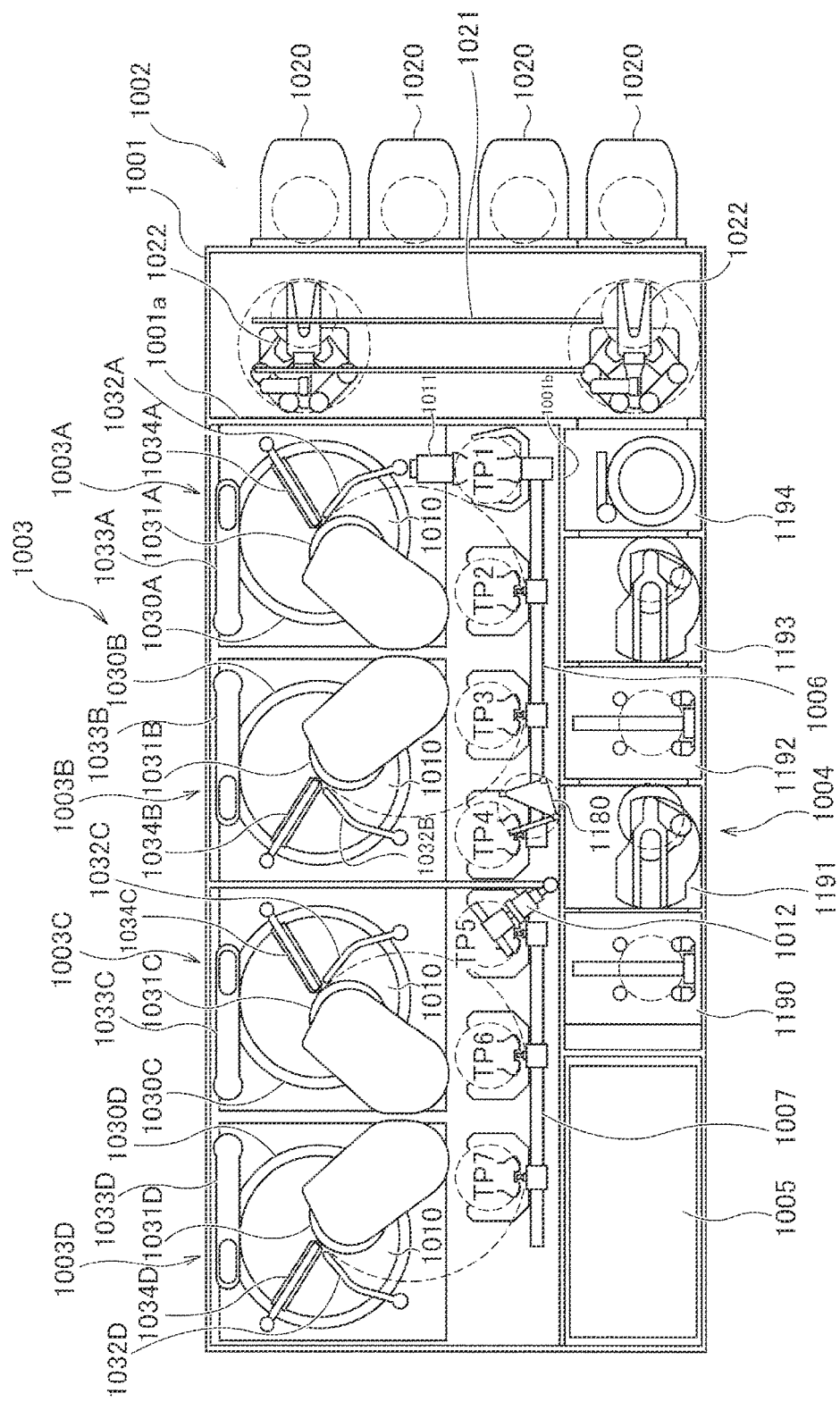
FIG. 10 is a plan view showing a whole structure of a substrate processing apparatus of the present embodiment.

FIG. 10 is a plan view showing a whole structure of the substrate processing apparatus in accordance with one embodiment of the present invention. As shown in FIG. 10, the CMP device is provided with a substantially rectangular housing 1001. The inside of the housing 1001 has divisions for the loading and unloading unit 1002, the polishing unit 1003, the cleaning unit 1004 by partition walls 1001a and 1001b. Each of the loading and unloading unit 1002, the polishing unit 1003, and the cleaning unit 1004, is independently assembled, and is independently exhausted. In addition, the CMP device includes the control unit 1005 that controls various operations of the CMP device.

(Loading and Unloading Unit)

The loading and unloading unit 1002 includes front loading units 1020 on each of which two or more wafer cassettes for storing a large number of wafers (substrates) are loaded (four in the present embodiment). The front loading units 1020 are arranged adjacent to the housing 1001 along a width direction (a direction perpendicular to a longitudinal direction) of the substrate processing apparatus. In each of the front loading units 1020, an open cassette, a Standard Manufacturing Interface (SMIF) pod, or a Front Opening Unified Pod (FOUP), can be loaded. The SMIF and the FOUP are closed containers that house wafer cassettes inside thereof, and are capable of maintaining environment independent of an outer space by being covered with partition walls.

In addition, the loading and unloading unit 1002 is provided with a motion mechanism 1021 along an array of the front loading units 1020. On the motion mechanism 1021, there are installed two conveyance robots (a loader and a conveyance mechanism) 1022 movable along an array direction of the wafer cassettes. The conveyance robots 1022 are configured to be able to access the wafer cassettes loaded in the front loading units 1020 by moving on the motion mechanism 1021. Each of the conveyance robots 1022 is provided with two hands up and down. An upper hand is used when a treated wafer is returned to any of the wafer cassettes, and a lower hand is used when a wafer before processing is taken out of any of the wafer cassettes. As above, the upper and lower hands can be properly used. In addition, the lower hand of each of the conveyance robots 1022 is configured to be able to reverse a wafer by turning around an axis of the lower hand.

Since the loading and unloading unit 1002 is required to be kept clean as much as possible, the inside of the loading and unloading unit 1002 is constantly maintained at a pressure higher than a pressure of any of the outside of the CMP device, the polishing unit 1003, and the cleaning unit 1004. The polishing unit 1003 is the dirtiest area in the substrate processing apparatus due to use of slurry as abrasive liquid. Thus, negative pressure is generated inside the polishing unit 1003. The pressure is maintained lower than internal pressure of the cleaning unit 1004. The loading and unloading unit 1002 is provided with a filter fan unit (not shown) that includes a clean air filter, such as a HEPA filter, an ULPA filter, and a chemical filter. The filter fan unit constantly blows clean air in which particles, noxious fume, and noxious gas are removed.

(Polishing Unit)

In the polishing unit 1003, wafers are to be polished (flattened). The polishing unit 1003 includes a first polishing unit 1003A, a second polishing unit 1003B, a third polishing unit 1003C, and a fourth polishing unit 1003D. As shown in FIG. 10, the first polishing unit 1003A, the second polishing unit 1003B, the third polishing unit 1003C, and the fourth polishing unit 1003D are arranged along the longitudinal direction of the substrate processing apparatus.

As shown in FIG. 10, the first polishing unit 1003A includes: a polishing table 1030A to which a polishing pad 1010 including a polishing surface is attached; a top ring 1031A for polishing a wafer by pressing the wafer on the polishing pad 1010 on the polishing table 1030A while holding the wafer; an abrasive liquid supply nozzle 1032A for supplying abrasive liquid and dressing liquid (such as pure water) to the polishing pad 1010; a dresser 1033A for dressing the polishing surface of the polishing pad 1010; and an atomizer 1034A that turns mixed fluid of liquid (such as pure water) and gas (such as nitrogen gas), or liquid (such as pure water), into a spray to inject the spray on the polishing surface.

Likewise, the second polishing unit 1003B includes a polishing table 1030B to which a polishing pad 1010 is attached, a top ring 1031B, an abrasive liquid supply nozzle 1032B, a dresser 1033B, and an atomizer 1034B. In addition, the third polishing unit 1003C includes a polishing table 1030C to which a polishing pad 1010 is attached, a top ring 1031C, an abrasive liquid supply nozzle 1032C, a dresser 1033C, and an atomizer 1034C, as well as the fourth polishing unit 1003D includes a polishing table 1030D to which a polishing pad 1010 is attached, a top ring 1031D, an abrasive liquid supply nozzle 1032D, a dresser 1033D, and an atomizer 1034D.

Since each of the first polishing unit 1003A, the second polishing unit 1003B, the third polishing unit 1003C, and the fourth polishing unit 1003D, has the same structure, hereinafter, the first polishing unit 1003A will be described.

Figure 11:
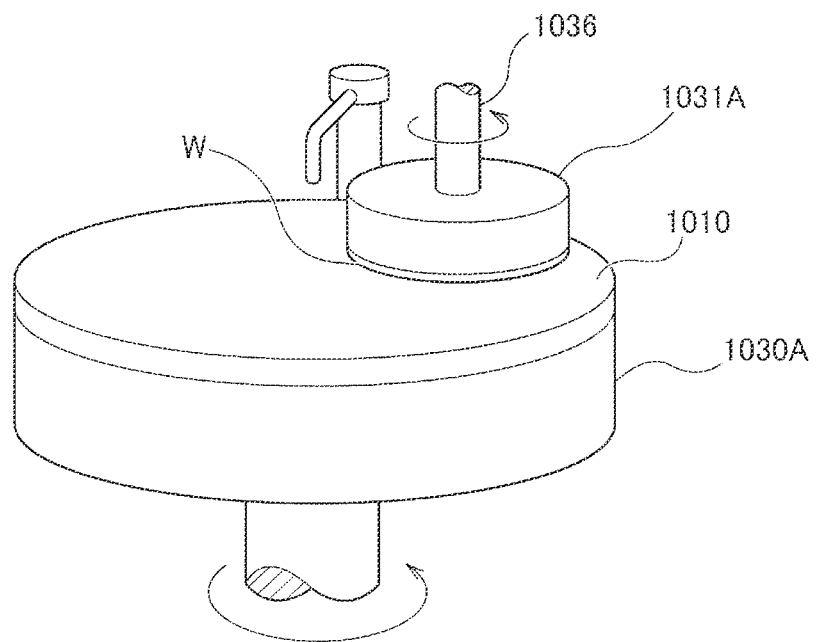
FIG. 11 is a perspective view that schematically shows the polishing unit.

FIG. 11 is a perspective view that schematically shows the first polishing unit 1003A. The top ring 1031A is supported by a top ring shaft 1036. The polishing table 1030A includes a top face to which the polishing pad 1010 is attached, and a top face of the polishing pad 1010 constitutes a polishing surface on which a wafer W is polished. Fixed abrasive grains may be used instead of the polishing pad 1010. The top ring 1031A and the polishing table 1030A are configured so as to turn around their respective axes with respective driving units that are not shown, as indicated by arrows. Thus, a gas-liquid two-phase flow including polishing abrasive liquid supplied to the polishing pad 1010 flows to the outside of the polishing pad 1010 due to a centrifugal force. The wafer W is held on a lower surface of the top ring 1031A by vacuum suction. At the time of polishing, abrasive liquid is supplied to the polishing surface of the polishing pad 1010 from the abrasive liquid supply nozzle 1032A, and the wafer W as a polishing object is pressed on the polishing surface by the top ring 1031A to be polished.

Next, a conveyance mechanism for conveying wafers will be described. As shown in FIG. 1, a first linear transporter 1006 is arranged adjacent to the first polishing unit 1003A and the second polishing unit 1003B. The first linear transporter 1006 serves as a mechanism for conveying a wafer among four conveyance positions (indicated as a first conveyance position TP1, a second conveyance position TP2, a third conveyance position TP3, and a fourth conveyance position TP4, in order from the loading and unloading unit) along a direction in which the polishing units 1003A and 1003B are arranged.

In addition, a second linear transporter 1007 is arranged adjacent to the third polishing unit 1003C and the fourth polishing unit 1003D. The second linear transporter 1007 serves as a mechanism for conveying a wafer among three conveyance positions (indicated as a fifth conveyance position TP5, a sixth conveyance position TP6, and a seventh conveyance position TP7, in order from the loading and unloading unit) along a direction in which the polishing units 1003C and 1003D are arranged.

The first linear transporter 1006 conveys a wafer to the polishing units 1003A and 1003B. The top ring 1031A of the first polishing unit 1003A is moved between a polishing position and the second conveyance position TP2 by swing operation of a top ring head. Thus, a wafer is delivered to the top ring 1031A at the second conveyance position TP2. Likewise, the top ring 1031B of the second polishing unit 1003B is moved between a polishing position and the third conveyance position TP3, and a wafer is delivered to the top ring 1031B at the third conveyance position TP3. In addition, the top ring 1031C of the third polishing unit 1003C is moved between a polishing position and the sixth conveyance position TP6, and a wafer is delivered to the top ring 1031C at the sixth conveyance position TP6, as well as the top ring 1031D of the fourth polishing unit 1003D is moved between a polishing position and the seventh conveyance position TP7, and a wafer is delivered to the top ring 1031D at the seventh conveyance position TP7.

At the first conveyance position TP1, a lifter 1011 is arranged to receive a wafer from the conveyance robot 1022. The wafer is delivered to the first linear transporter 1006 from the conveyance robot 1022 through the lifter 1011. There is provided a shutter (not shown) in a partition wall 1001a to be positioned between the lifter 1011 and the conveyance robot 1022. The shutter is configured to be opened when a wafer is conveyed so that the wafer is delivered to the lifter 1011 from the conveyance robot 1022. In addition, there is arranged a swing transporter 1012 among the first linear transporter 1006, the second linear transporter 1007, and the cleaning unit 1004. The swing transporter 1012 is provided with a hand that is movable between the fourth conveyance position TP4 and the fifth conveyance position TP5. The swing transporter 1012 delivers a wafer to the second linear transporter 1007 from the first linear transporter 1006. The second linear transporter 1007 conveys the wafer to the third polishing unit 1003C and/or the fourth polishing unit 1003D. In addition, the wafer polished by the polishing unit 1003 is conveyed to the cleaning unit 1004 through the swing transporter 1012.

(Cleaning Unit)

Figure 12A:
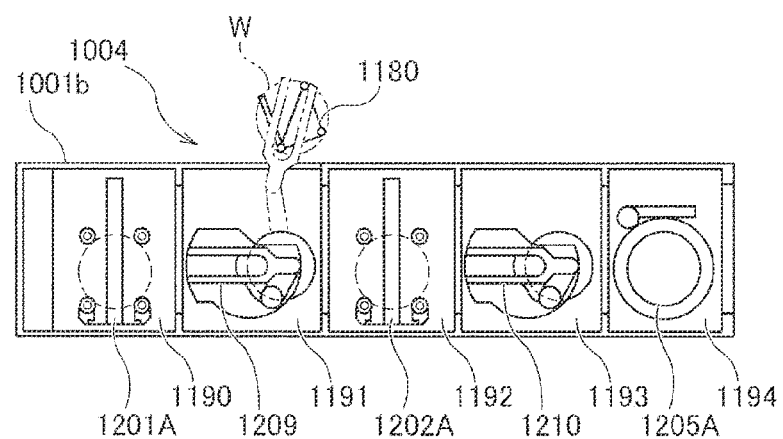
FIG. 12A is a plan view showing a cleaning unit.
Figure 12B:
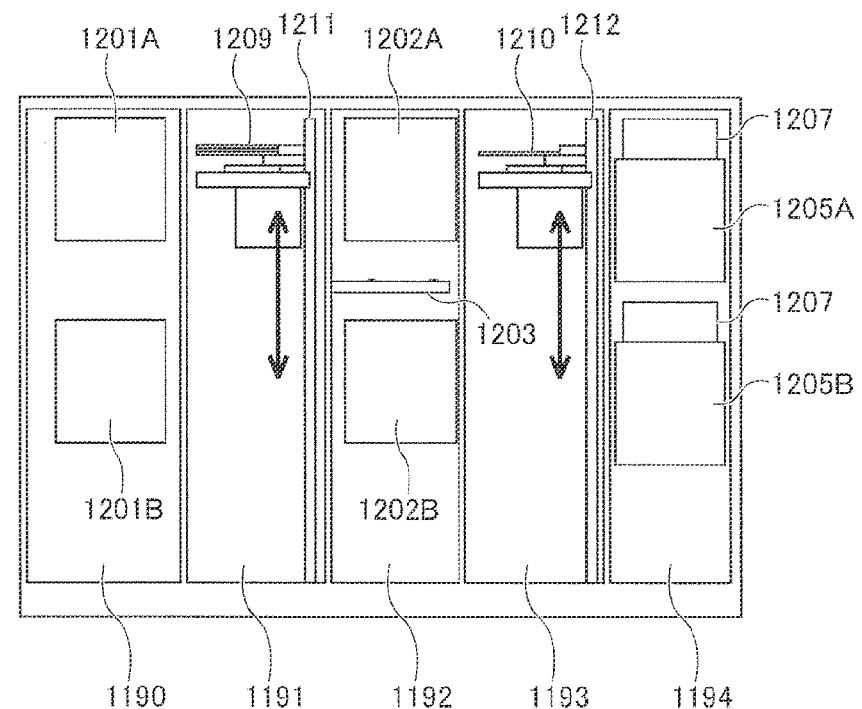
FIG. 12B is a side view showing the cleaning unit.

FIG. 12A is a plan view showing the cleaning unit 1004, and FIG. 12B is a side view showing the cleaning unit 1004.

As shown in FIGS. 12A and 12B, the cleaning unit 1004 is divided into a first cleaning chamber 1190, a first conveyance chamber 1191, a second cleaning chamber 1192, a second conveyance chamber 1193, and a drying chamber 1194. In the first cleaning chamber 1190, an upper primary cleaning module 1201A and a lower primary cleaning module 1201B are arranged along vertical direction. The upper primary cleaning module 1201A is arranged above the lower primary cleaning module 1201B. Likewise, in the second cleaning chamber 1192, an upper secondary cleaning module 1202A and a lower secondary cleaning module 1202B are arranged along the vertical direction. The upper secondary cleaning module 1202A is arranged above the lower secondary cleaning module 1202B. The primary and secondary cleaning modules 1201A, 1201B, 1202A, and 1202B, serve as a cleaning machine for cleaning a wafer by using cleaning liquid. Since the primary and secondary cleaning modules 1201A, 1201B, 1202A, and 1202B, are arranged along the vertical direction, an advantage of a small footprint can be obtained.

There is provided a temporary storage table 1203 for a wafer between the upper secondary cleaning module 1202A and the lower secondary cleaning module 1202B. In the drying chamber 1194, an upper drying module 1205A and a lower drying module 1205B are arranged along a vertical direction. The upper drying module 1205A and the lower drying module 1205B are separated from each other. Above the upper drying module 1205A and the lower drying module 1205B, there are provided filter fan units 1207 and 1207 that supply clean air to the drying modules 1205A and 1205B, respectively. The upper primary cleaning module 1201A, the lower primary cleaning module 1201B, the upper secondary cleaning module 1202A, the lower secondary cleaning module 1202B, the temporary storage table 1203, the upper drying module 1205A, and the lower drying module 1205B, are fixed to a frame that is not shown with a bolt and the like.

In the first conveyance chamber 1191, there is arranged a first conveyance robot (conveyance mechanism) 1209 that is vertically movable, and in the second conveyance chamber 1193, there is arranged a second conveyance robot 1210 that is vertically movable. The first conveyance robot 1209 and the second conveyance robot 1210 are supported by support shafts 1211 and 1212 extending in the vertical direction in a movable manner, respectively. The first conveyance robot 1209 and the second conveyance robot 1210 are provided inside with a drive mechanism, such as a motor, so as to be vertically movable along the support shafts 1211 and 1212, respectively. The first conveyance robot 1209 includes two hands up and down as with the conveyance robot 1022. As shown in FIG. 12A with dotted lines, the first conveyance robot 1209 includes a lower hand that is arranged at a position where the lower hand can access the temporary storage table 1180 described above. When the lower hand of the first conveyance robot 1209 accesses the temporary storage table 1180, a shutter (not shown) provided in the partition wall 1001b opens.

The first conveyance robot 1209 operates so as to convey the wafer W among the temporary storage table 1180, the upper primary cleaning module 1201A, the lower primary cleaning module 1201B, the temporary storage table 1203, the upper secondary cleaning module 1202A, and the lower secondary cleaning module 1202B. When conveying a wafer before cleaning (a wafer to which slurry is attached), the first conveyance robot 1209 uses the lower hand, and when conveying a wafer after cleaning, the first conveyance robot 1209 uses the upper hand. The second conveyance robot 1210 operates so as to convey the wafer W among the upper secondary cleaning module 1202A, the lower secondary cleaning module 1202B, the temporary storage table 1203, the upper drying module 1205A, and the lower drying module 1205B. Since the second conveyance robot 1210 conveys only a cleaned wafer, it includes only one hand. The conveyance robot 1022 shown in FIG. 1 uses its upper hand to take out a wafer from the upper drying module 1205A or the lower drying module 1205B and to return the wafer to a wafer cassette. When the upper hand of the conveyance robot 1022 accesses the drying modules 1205A and 1205B, a shutter (not shown) provided in the partition wall 1001a opens.

(Lifting Device)

Next, a lifting device will be described. As described above, the CMP device includes the loading and unloading unit 1002, the polishing unit 1003a, the polishing unit 1003b, the cleaning unit 1004, and the control unit 1005. Each of the units above is independently manufactured, and is transported to an installation place (operation place) of the substrate processing apparatus. The CMP device is installed by assembling a plurality of the transported units. When maintenance of a unit of the CMP device is performed, for example, it is difficult to perform the maintenance while a plurality of units is assembled. Thus, a unit of a maintenance object is removed from the CMP device to perform the maintenance. In order to take out the unit of the maintenance object from the CMP device, the unit of the maintenance object is extracted and conveyed by using a lifting device in the present embodiment.

Hereinafter, extraction and conveyance of the cleaning unit 1004 will be described as a representative of the plurality of units. FIG. 13 schematically shows a state at the time of extracting and conveying the cleaning unit 1004.

As shown in FIG. 13, when the cleaning unit 1004 is extracted and conveyed for maintenance and the like, a dolly 1700 is provided between a floor surface 1690 on which the cleaning unit 1004 (CMP device) is installed and the cleaning unit 1004. The cleaning unit 1004 is extracted and conveyed by using the dolly 1700. In order to load the cleaning unit 1004 on the dolly 1700, it is required to lift the cleaning unit 1004. Thus, when the cleaning unit 1004 is extracted and conveyed, a lifting device 1630 capable of lifting the cleaning unit 1004 is provided between the floor surface 1690 and the cleaning unit 1004.

In an area A in FIG. 13, the control unit 1005 is to be installed adjacent to the cleaning unit 1004. In an area B, the polishing units 1003a and 1003b are to be installed adjacent to the cleaning unit 1004, and in an area C, the loading and unloading unit 1002 is to be installed adjacent to the cleaning unit 1004. Thus, an area D is to be an operation place at the time of extracting and conveying the cleaning unit 1004. An operator needs to operate the lifting device 1630 from the operation place in the area D to lift the whole of the cleaning unit 1004, and can easily access (reach) a portion of the units, close to the operation place in the area D. On the other hand, an operator cannot easily access (reach) a portion of the units, away from the operation place in the area D (a portion of the cleaning unit 1004, adjacent to the area B). In addition, difficulty in accessing a portion of the units, away from the operation place in the area D (a portion of the cleaning unit 1004, adjacent to the area B) becomes noticeable as the cleaning unit 1004 increases in size to result in increasing size of the CMP device.

The present embodiment realizes the lifting device 1630 capable of easily adjusting height of the cleaning unit 1004 (or another unit). Hereinafter, the lifting device 1630 will be described.

Figure 14:
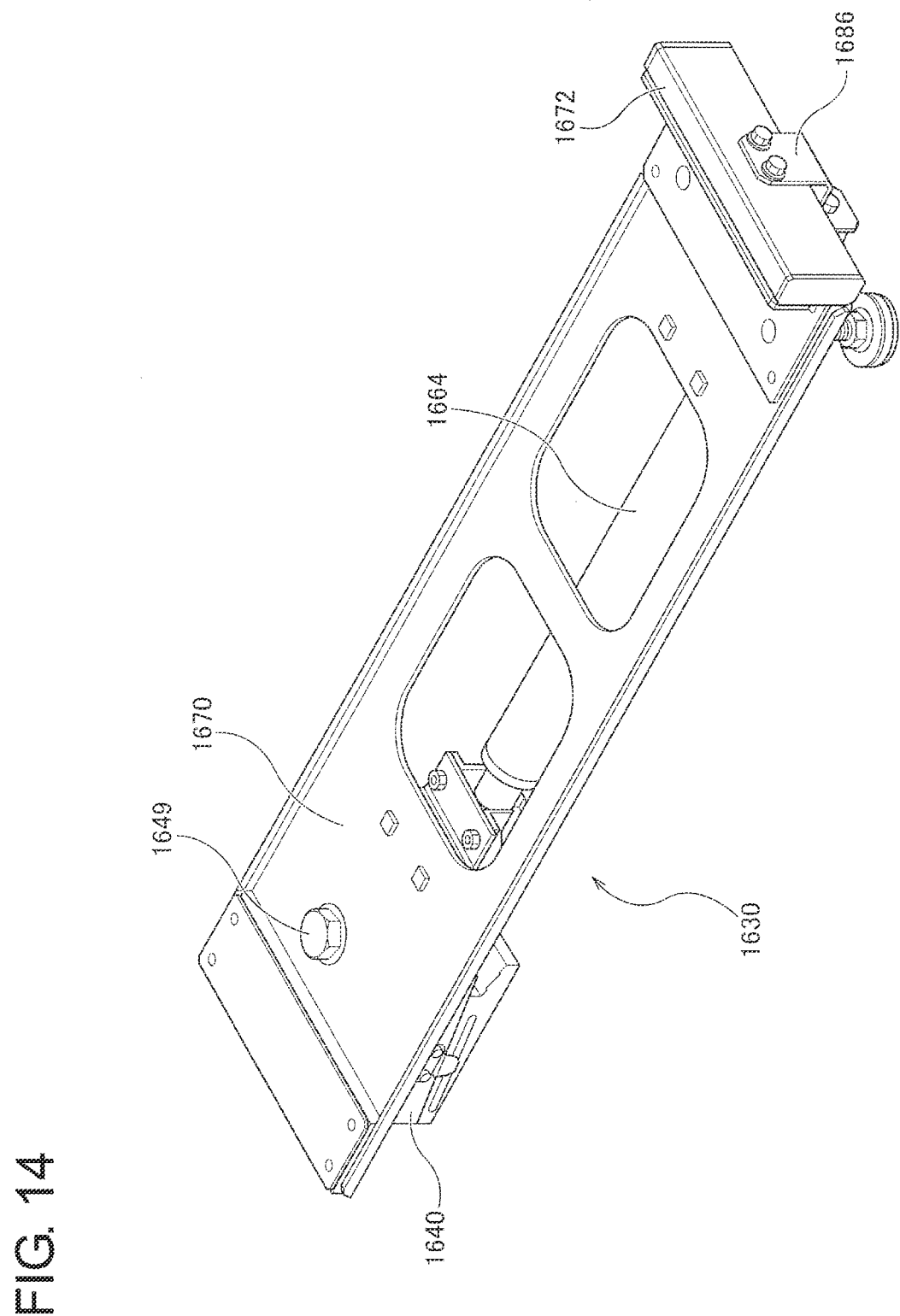
FIG. 14 is a perspective view of a lifting device 1630 of the present embodiment.
Figure 15:
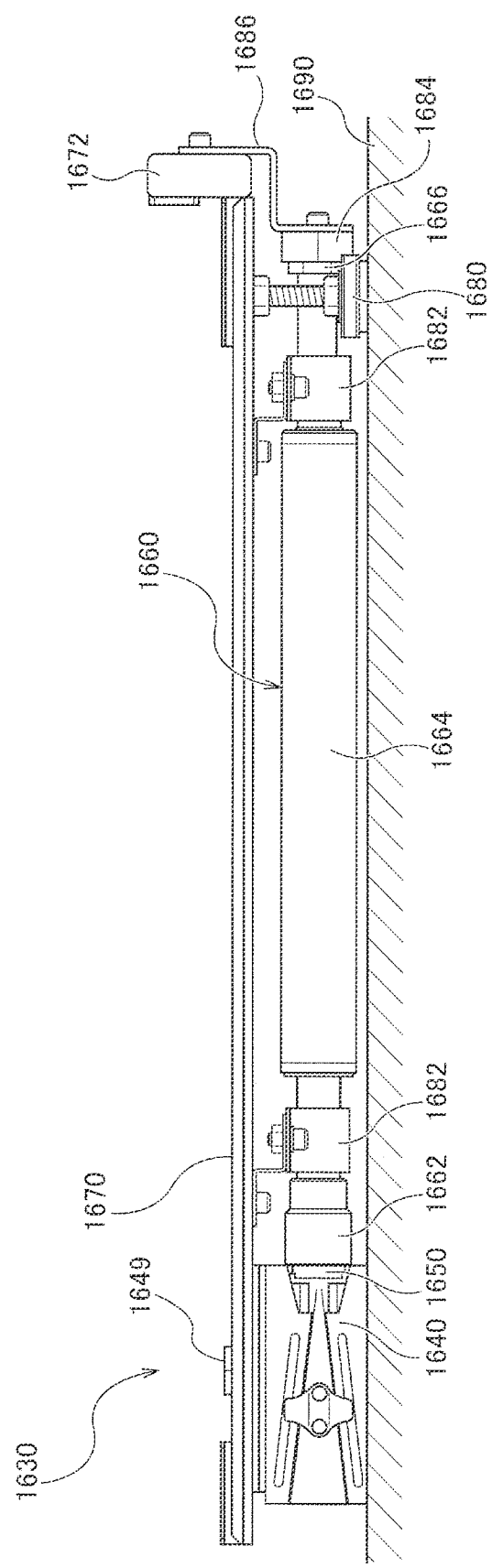
FIG. 15 is a side view of the lifting device 1630 of the present embodiment.
Figure 16:
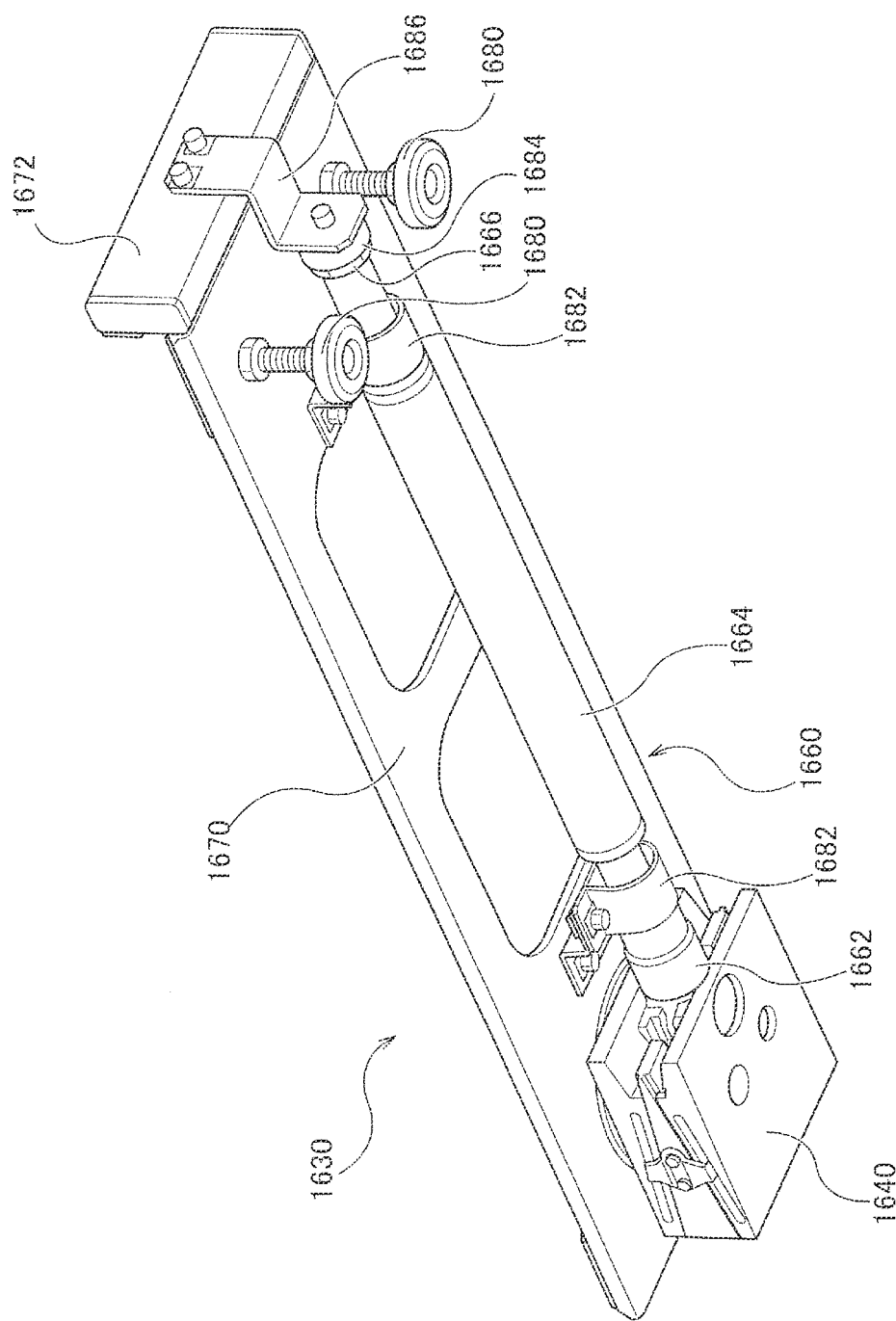
FIG. 16 is a perspective view of the lifting device 1630 of the present embodiment.
Figure 17:
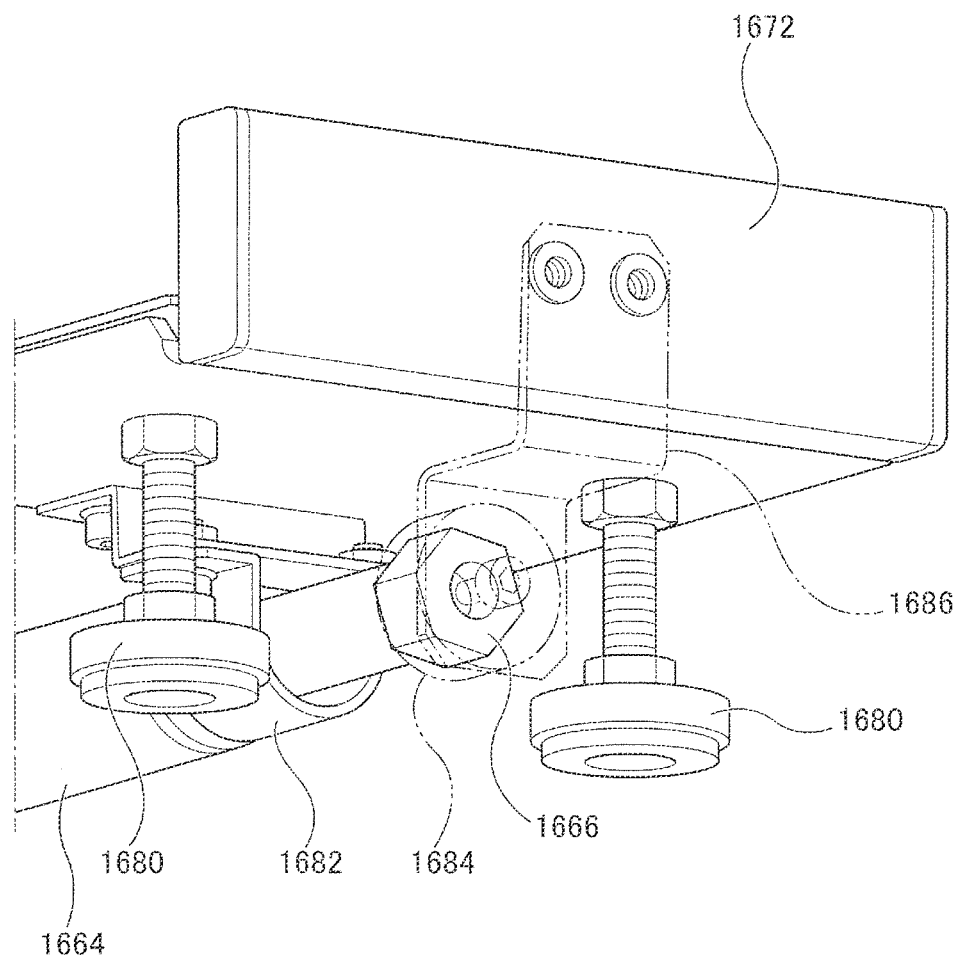
FIG. 17 is an enlarged perspective view of one end of the lifting device 1630 of the present embodiment.
Figure 18:
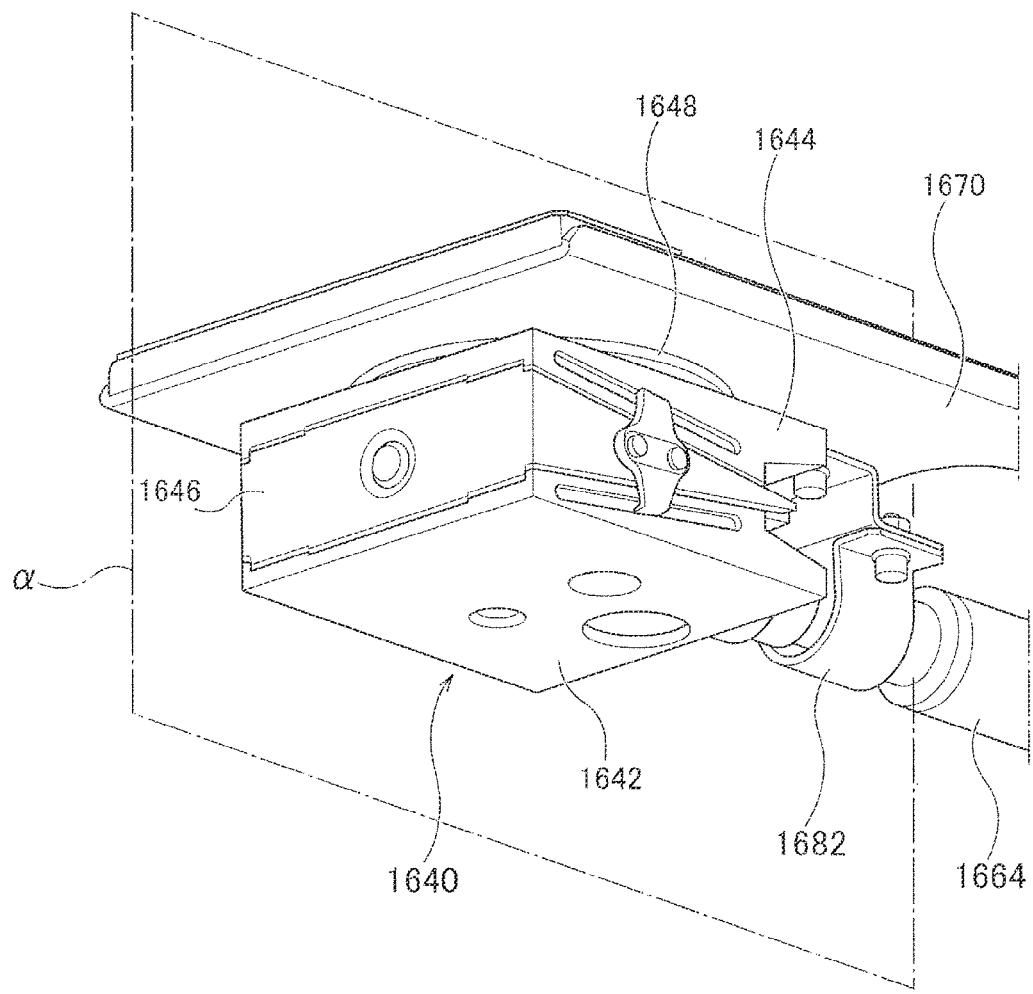
FIG. 18 is an enlarged perspective view of the other end of the lifting device 1630 of the present embodiment.
Figure 19:
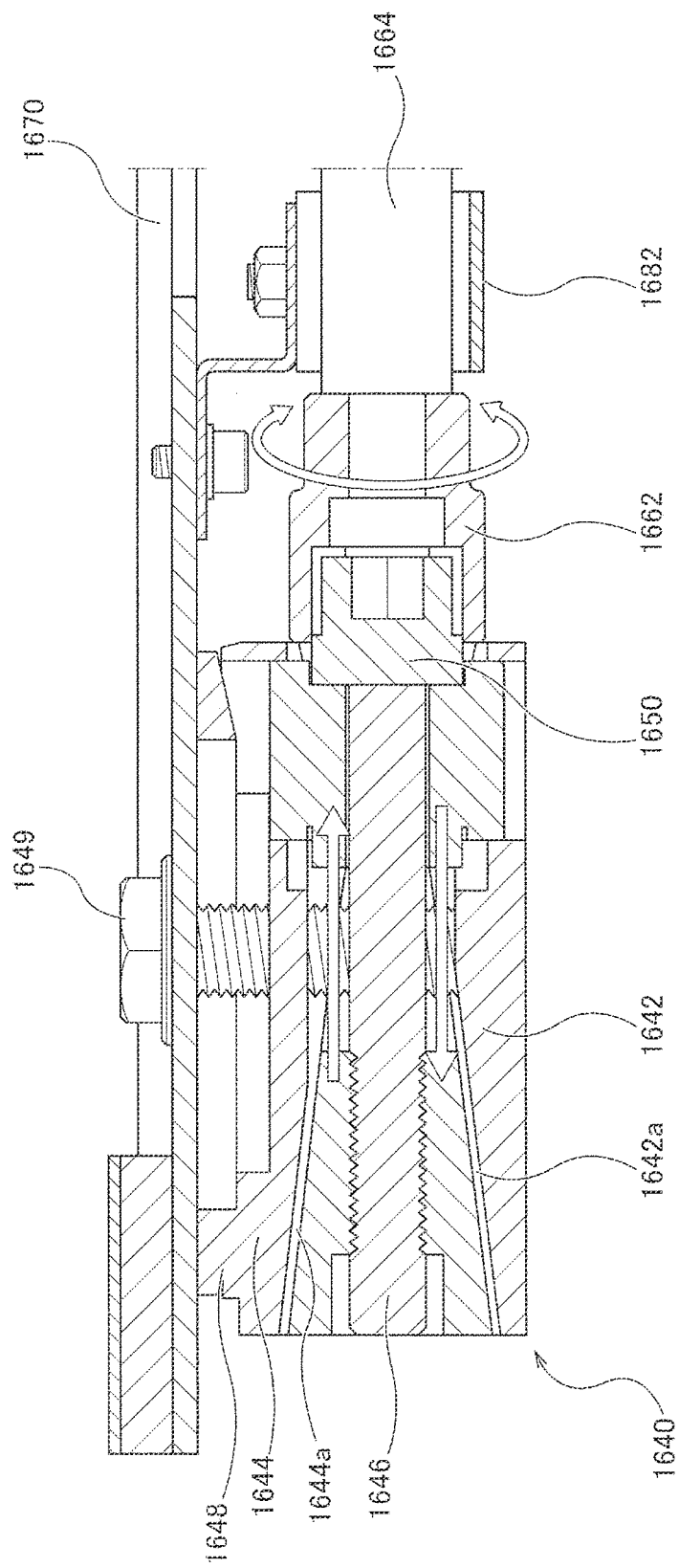
FIG. 19 is a sectional view of a lifting mechanism taken at a plane α in FIG. 18.

FIG. 14 is a perspective view of the lifting device 1630 of the present embodiment; FIG. 15 is a side view of the lifting device 1630 of the present embodiment; FIG. 16 is a perspective view of the lifting device 1630 of the present embodiment; FIG. 17 is an enlarged perspective view of one end of the lifting device 1630 of the present embodiment; FIG. 18 is an enlarged perspective view of the other end of the lifting device 1630 of the present embodiment; FIG. 19 is a sectional view of a lifting mechanism taken at a plane α in FIG. 18; and FIG. 20 is an illustration of operation of the lifting device 1630 of the present embodiment.

As shown in FIGS. 11 to 20, the lifting device 1630 includes: a plate 1670 that supports a lower surface of the cleaning unit 1004; a lifting mechanism 1640 that is provided between the plate 1670 and the floor surface 1690, and that is capable of adjusting height of the cleaning unit 1004 with respect to the floor surface 1690; and an adjustment member 1660 connected to the lifting mechanism 1640. The adjustment member 1660 is provided with an extended section (rod) 1664 extended from the lifting mechanism 1640 along the plate 1670, and is configured to be able to operate the lifting mechanism 1640 through the extended section 1664. Specifically, the lifting device 1630 includes a height adjustment knob (a height adjuster) 1650 provided in the lifting mechanism 1640, and the adjustment member 1660 is connected to the height adjustment knob 1650. The lifting mechanism 1640 is provided at one end of the plate 1670 on a floor surface 1690 side. In addition, the lifting device 1630 is provided at the other end of the plate 1670 on the floor surface 1690 side, and includes two height adjusters 1680 capable of adjusting height of the cleaning unit 1004 with respect to the floor surface 1690.

The lifting mechanism 1640 includes the first member 1642 and the second member 1644 stacked between the floor surface 1690 and the plate 1670, as shown in FIG. 19. The first member 1642 and the second member 1644 are provided with surfaces 1642a and 1644a facing to each other, respectively, the surfaces being formed so as not to be horizontal to each other. The surfaces 1642a and 1644a facing to each other are formed so as to be a wedge shape in a side view. In addition, the lifting mechanism 1640 includes a third member 1646 provided between the first member 1642 and the second member 1644 so as to be a wedge shape. Further, the lifting mechanism 1640 includes a fourth member 1648 of an approximate circular shape, provided above the first member 1642. The lifting mechanism 1640 is fixed to the plate 1670 with a bolt 1649.

The height adjustment knob 1650 is a member capable of adjusting height of cleaning unit 1004 with respect to the floor surface 1690 (is capable of lifting and lowering the cleaning unit 1004) by driving the lifting mechanism 1640 (third member 1646). Specifically, turning the height adjustment knob 1650 allows a bolt that is not shown, interlocked with the height adjustment knob 1650, to be turned to drive the third member 1646 to slide.

The adjustment member 1660 includes: a connection section 1662 connected to the height adjustment knob 1650; a rod-like extended section (rod) 1664 extending from the connection section 1662 along the plate 1670; and an operation section 1666 provided in the extended section 1664. The adjustment member 1660 is configured to be able to operate the lifting mechanism 1640 through the height adjustment knob 1650 by operating the operation section 1666. The extended section 1664 extends in a direction of the height adjuster 1680 through insides of two saddles 1682 fixed to the plate 1670 on the floor surface 1690 side. The saddles 1682 prevent the lifting device 1630 from turning around the bolt 1649. The extended section 1664 is not supported by the saddles 1682, but is supported by only the lifting mechanism 1640. The operation section 1666 is covered with a stopper 1684. The stopper 1684 is fixed to an erect portion 1672 at an end of the plate 1670, by using a bracket 1686. The stopper 1684 and the bracket 1686 are removed when height of the cleaning unit 1004 is adjusted by using the lifting device 1630. In the present embodiment, the connection section 1662 is provided at the first end of the extended section 1664, and the operation section 1666 is provided at the second end of the extended section 1664, but the configuration is not limited to the above.

The adjustment member 1660 is configured to be able to drive the lifting mechanism 1640 (third member 1646) through the height adjustment knob 1650 by operating the operation section 1666. Specifically, when an operator turns the operation section 1666 around an axis in an extending direction of the extended section 1664 by using a tool, the extended section 1664 turns, and the connection section 1662 and the level adjustment knob 1650 turn in conjunction with the extended section 1664. In the present embodiment, there is shown an example in which an operator turns the operation section 1666 by using a tool, but an example is not limited to the above. It is also possible that an operator turns the operation section 1666 by using an electric tool or the like.

Figure 20A:
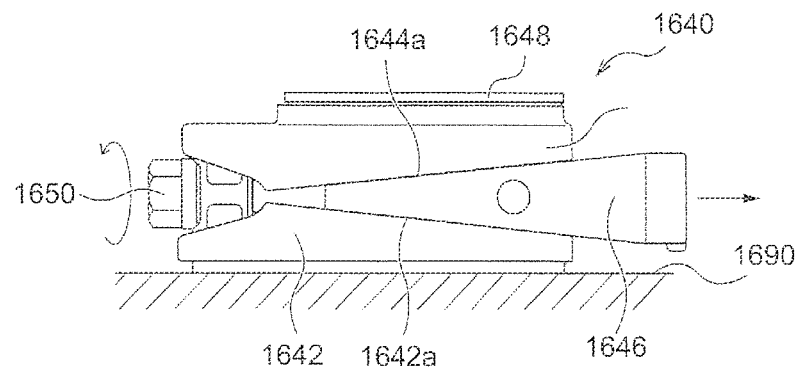
FIG. 20A is an illustration of operation of the lifting device 1630 of the present embodiment.

For example, as shown in FIG. 20A, when the height adjustment knob 1650 is turned in one direction (counterclockwise, for example) through the adjustment member 1660, the third member 1646 is driven to slide away from the height adjustment knob 1650. When the third member 1646 is driven to slide away from the height adjustment knob 1650, the second member 1644 moves toward the floor surface 1690 so that the first member 1642 and the second member 1644 are relatively close to each other. Accordingly, height of the cleaning unit 1004 with respect to the floor surface 1690 decreases.

Figure 20B:
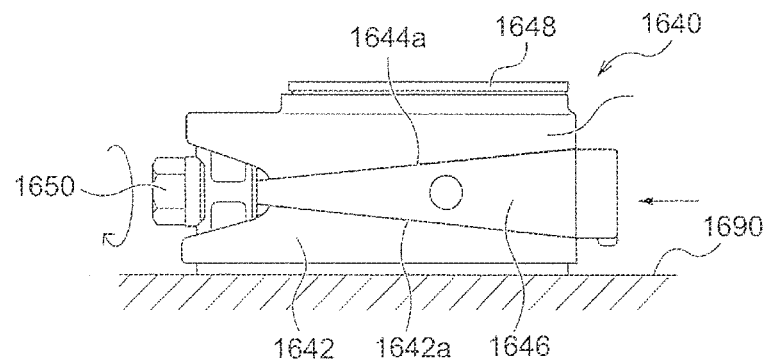
FIG. 20B is an illustration of operation of the lifting device 1630 of the present embodiment.

On the other hand, as shown in FIG. 20B, when the height adjustment knob 1650 is turned in the opposite direction (clockwise, for example) through the adjustment member 1660, the third member 1646 is driven to slide close to the height adjustment knob 1650. When the third member 1646 is driven to slide close to the height adjustment knob 1650, the second member 1644 moves away from the floor surface 1690 so that the first member 1642 and the second member 1644 are relatively away from each other. Accordingly, height of the cleaning unit 1004 with respect to the floor surface 1690 increases.

Figure 20C:
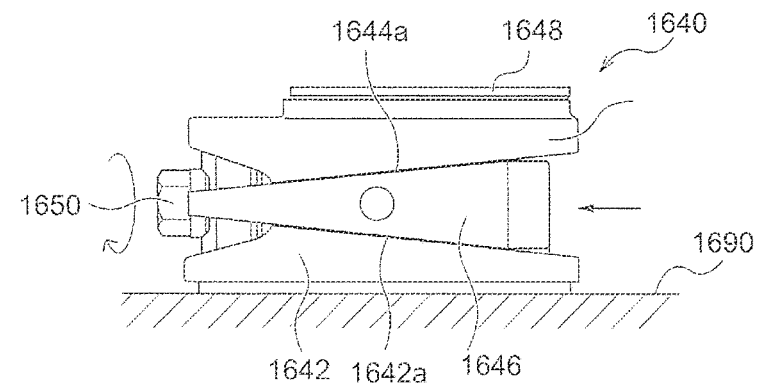
FIG. 20C is an illustration of operation of the lifting device 1630 of the present embodiment.

In addition, as shown in FIG. 20C, when the height adjustment knob 1650 is turned in a direction as with FIG. 20B (clockwise, for example) through the adjustment member 1660, the third member 1646 is driven to slide close to the height adjustment knob 1650. When the third member 1646 is driven to slide close to the height adjustment knob 1650, the second member 1644 moves further away from the floor surface 1690 so that the first member 1642 and the second member 1644 are relatively further away from each other. Accordingly, height of the cleaning unit 1004 with respect to the floor surface 1690 further increases.

(Dolly)

Figure 21:
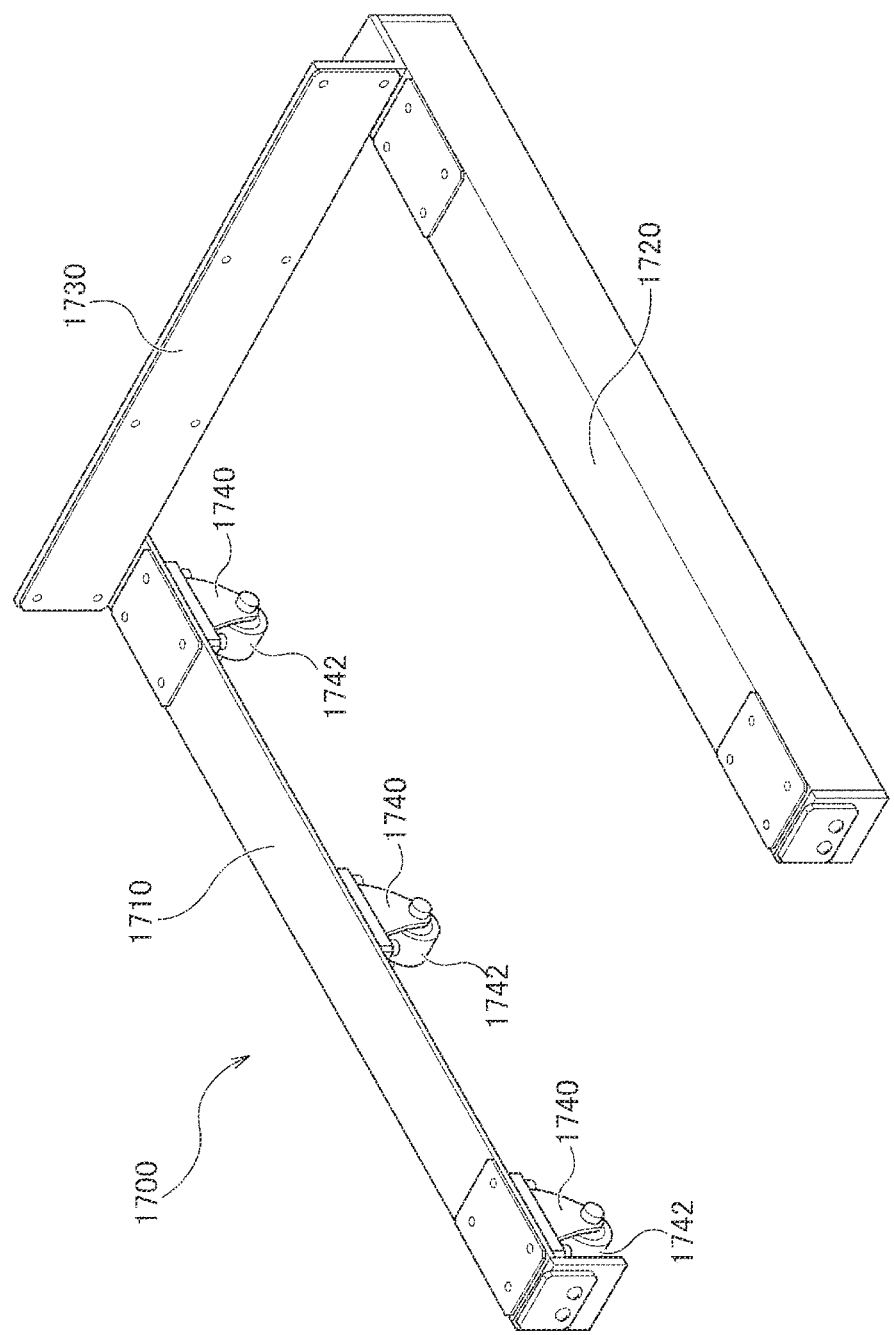
FIG. 21 is a perspective view of a dolly 1700.

Next, the dolly 1700 will be described. FIG. 21 is a perspective view of the dolly 1700, and FIG. 22 is a bottom view of the dolly 1700.

Figure 22:
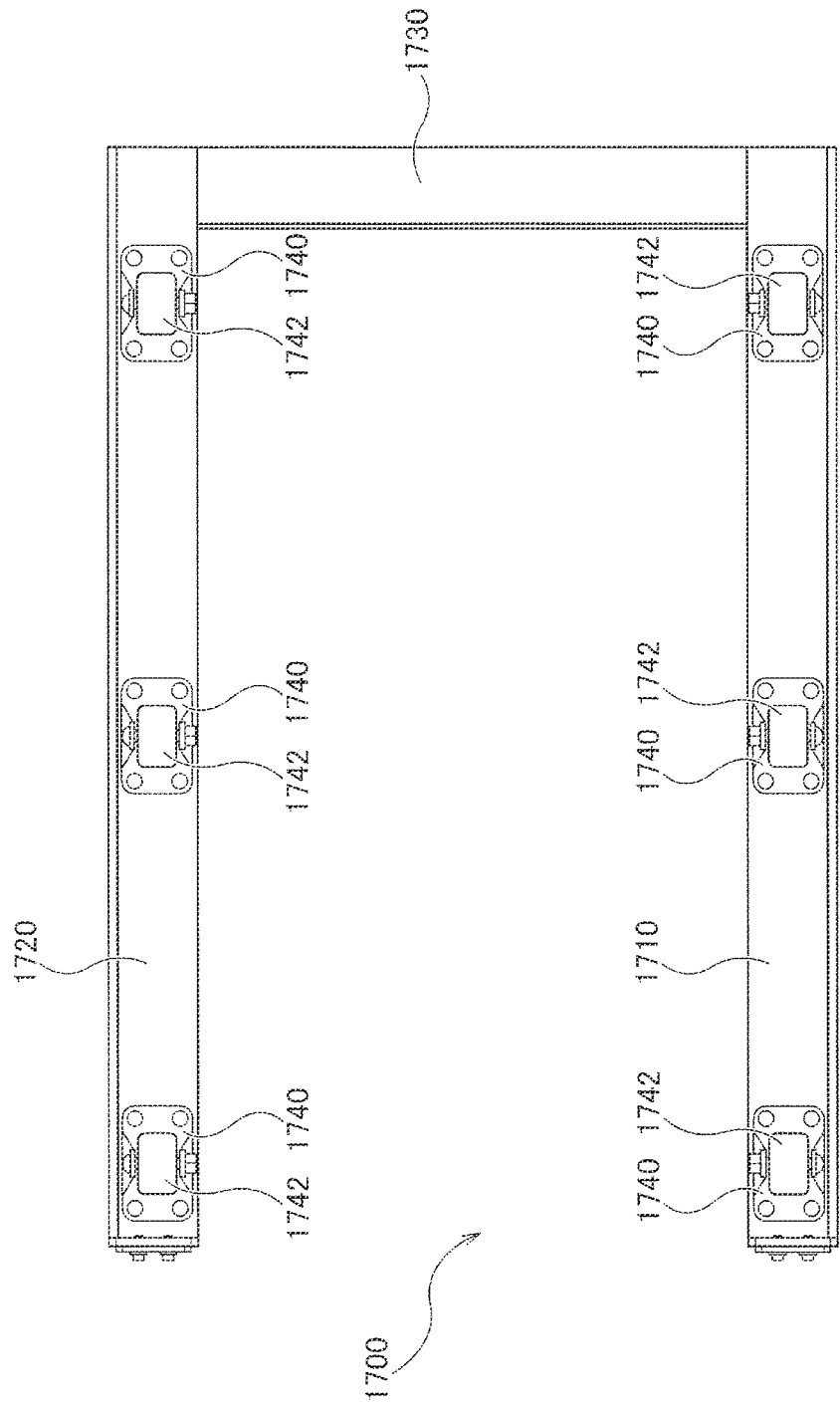
FIG. 22 is a bottom view of the dolly 1700.

As shown in FIGS. 21 and 22, the dolly 1700 includes: a pair of arm members 1710 and 1720 extending parallel to each other; a connection member 1730 for connecting the arm members 1710 and 1720; and a plurality of caster members 1740 provided in each of the arm members 1710 and 1720 on the floor surface 1690 side. Three caster members 1740 are provided in each of the arm members 1710 and 1720. Each of the caster members 1740 is provided with a wheel 1742 that can roll along an extending direction of the arm members 1710 and 1720.

(Method of Conveying Unit)

Figure 23:
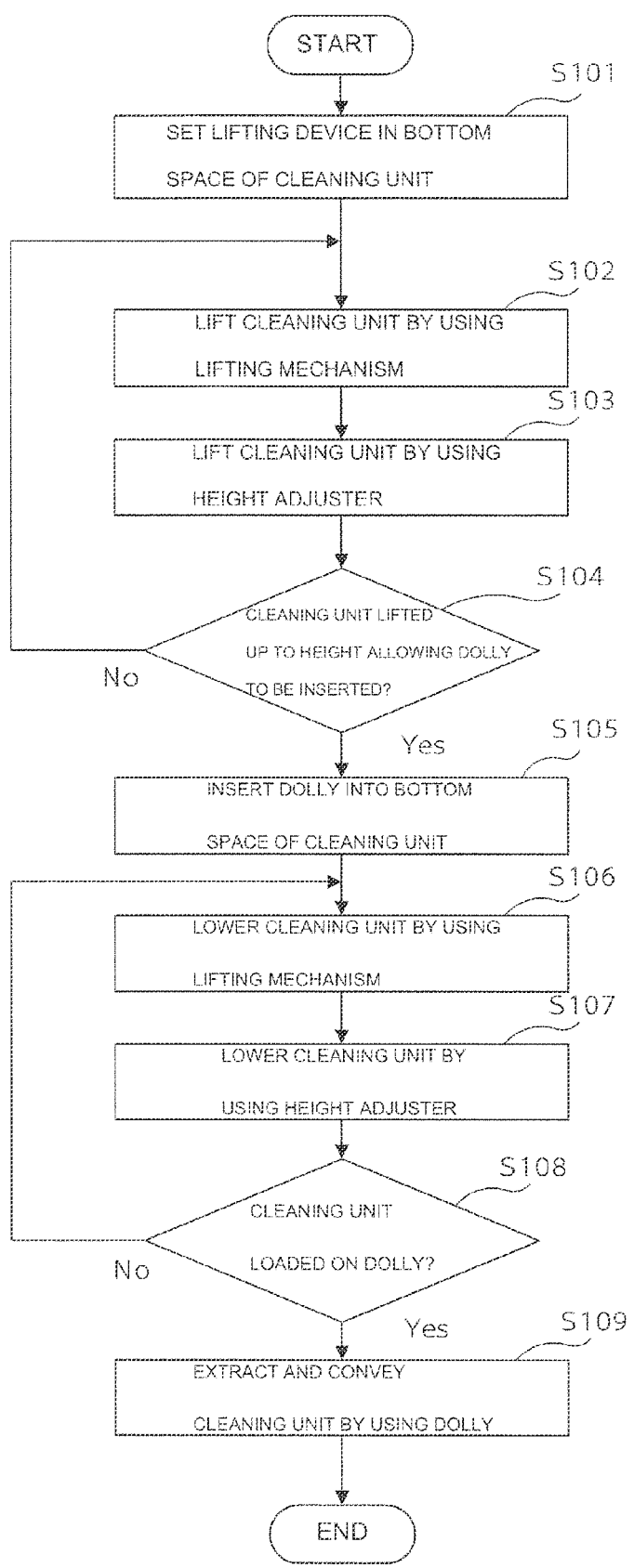
FIG. 23 is a flow chart of a method of conveying a unit of the present embodiment.

Next, a method of conveying a unit will be described. FIG. 23 is a flow chart of a method of conveying a unit of the present embodiment.

As shown in FIG. 23, in the method of conveying a unit, first the lifting device 1630 is set in a bottom space of the cleaning unit 1004 (step S101). Specifically, an operator sets the lifting devices 1630 at two places in the bottom space of the cleaning unit 1004 as shown in FIG. 13. Further specifically, the lifting device 1630 is set so that the lifting mechanism 1640 is arranged in a place (a place close to the area B) away from the area D and the height adjuster 1680 is arranged close to the area D. A setting position of each of the lifting devices 1630 and the setting number of the lifting devices 1630 are arbitrary, which is not limited to the present embodiment.

Subsequently, in the method of conveying a unit, the cleaning unit 1004 is lifted by using the lifting mechanism 1640 (step S102). Specifically, an operator turns the operation section 1666 clockwise, for example, by using a tool or the like to lift the cleaning unit 1004.

Subsequently, in the method of conveying a unit, the cleaning unit 1004 is lifted by using the height adjuster 1680 (step S103). Specifically, an operator turns a bolt of each of two height adjusters 1680 clockwise, for example, to lift the cleaning unit 1004.

Subsequently, in the method of conveying a unit, it is determined whether or not the cleaning unit 1004 is lifted up to a height that allows a dolly to be inserted (step S104). In the method of conveying a unit, if it is determined that the cleaning unit 1004 is not lifted up to the height that allows the dolly to be inserted (No in the step S104), processing returns to the step S102.

That is, in the method of conveying a unit, the cleaning unit 1004 is lifted up to a height that allows the dolly to be inserted by using the lifting mechanism 1640 and the height adjuster 1680. The order of the step S102 and the step S103 may be reversed.

In the method of conveying a unit, if it is determined that the cleaning unit 1004 is lifted up to a height that allows the dolly to be inserted (Yes in the step S104), the dolly 1700 is inserted into the bottom space of the cleaning unit 1004 (step S105). Specifically, an operator inserts the dolly 1700 into the bottom space at both edges of the cleaning unit 1004, as shown in FIG. 13. An insertion position of the dolly 1700 and the setting number of the dollies 1700 are arbitrary, which is not limited to the present embodiment.

Subsequently, in the method of conveying a unit, the cleaning unit 1004 is lowered by using the lifting mechanism 1640 (step S106). Specifically, an operator turns the operation section 1666 counterclockwise, for example, by using a tool or the like to lower the cleaning unit 1004.

Subsequently, in the method of conveying a unit, the cleaning unit 1004 is lowered by using the height adjuster 1680 (step S107). Specifically, an operator turns the bolt of each of the two height adjusters 1680 counterclockwise, for example, to lower the cleaning unit 1004.

Subsequently, in the method of conveying a unit, it is determined whether or not the cleaning unit 1004 is loaded on the dolly (step S108). In the method of conveying a unit, if it is determined that the cleaning unit 1004 is not loaded on the dolly (No in the step S108), the processing returns to the step S106.

That is, in the method of conveying a unit, the cleaning unit 1004 is lowered by using the lifting mechanism 1640 and the height adjuster 1680 until the cleaning unit 1004 is loaded on the dolly. The order of the step S106 and the step S107 may be reversed.

In the method of conveying a unit, if it is determined that the cleaning unit 1004 is loaded on the dolly (Yes in the step S108), the cleaning unit 1004 is extracted and conveyed by using the dolly 1700 (step S109). Specifically, an operator draws the dolly 1700 to allow the wheel 1742 to roll along the extending direction of the arm members 1710 and 1720 to extract and convey the cleaning unit 1004.

As above, in accordance with the present embodiment, since the adjustment member 1660 is provided, the operation section 1666 for driving the lifting mechanism 1640 (third member 1646) is positioned in an operation place of an operator, or close to the operation place. Accordingly, the operator can easily access even the lifting mechanism 1640 positioned away from the operation place. As a result, in accordance with the present embodiment, it is possible to easily adjust height of the cleaning unit 1004 regardless of size of the CMP device, whereby the cleaning unit 1004 can be easily extracted and conveyed. In addition, it is also possible to easily adjust a height of each of the loading and unloading unit 1002, the polishing unit 1003a, the polishing unit 1003b, and the control unit 1005, as with the cleaning unit 1004. As a result, it is possible to easily extract and convey the respective units.

REFERENCE SIGNS LIST 2 loading and unloading unit
3, 3a, 3b polishing unit
4 cleaning unit
600 unit body
610 base member
630, 630b, 730 lifting device
640 lifting mechanism
642a, 644a facing surface
642 first member
644 second member
646 third member
648 fourth member
650 level adjustment knob
660 level adjustment member
662 connection section
664 extended section
666 operation section
690 installation surface
740 guide member
750 first guide member
752 first contact section
754 first extended section
756 first locking section
760 second guide member
762 second contact section
764 second extended section
766 second locking section
1002 loading and unloading unit
1003 polishing unit
1003a, 1003b polishing unit 1004 cleaning unit
1005 control unit
1630 lifting device
1640 lifting mechanism
1642a, 1644a facing surface
1642 first member
1644 second member
1646 third member
1648 fourth member
1660 adjustment member
1662 connection section
1664 extended section
1666 operation section
1670 plate
1680 height adjuster
1690 floor surface
1700 dolly
1710, 1720 arm member
1730 connection member
1740 caster member
1742 wheel

What is claimed is:

1. A lifting device comprising:
a lifting mechanism that is provided between at least one of a plurality of units of a substrate processing apparatus and an installation surface of the unit, and that adjusts height of the at least one unit with respect to the installation surface;
an adjustment member that is provided with an extended section extended from the lifting mechanism, and that is capable of operating the lifting mechanism through the extended section; and
a level adjuster connected to the lifting mechanism, capable of adjusting height of the at least one unit with respect to the installation surface by driving the lifting mechanism, wherein the adjustment member includes a level adjustment member having a connection section connected to the level adjuster, the extended section extended from the connection section, and an operation section provided in the extended section, the level adjustment member being capable of driving the lifting mechanism through the level adjuster by operating the operation section, and
wherein the lifting mechanism includes: a first member and a second member that are stacked between the installation surface and the at least one unit, and each of which has a surface facing to each other so as not to be horizontal; and a third member provided between the first member and the second member so as to be wedge-shaped, and the level adjuster is capable of adjusting a distance between the first member and the second member by driving the third member to be slid.

2. The lifting device according to claim 1, further comprising a guide member, the guide member comprising:
a first guide member including:
a first contact section that is brought into contact with a surface of the first member, facing to the installation surface; first extended sections that extends along respective side surfaces of the first member, opposite to each other, from the first contact section; and projected first locking sections formed in the respective first extended sections;
a second guide member including:
a second contact section that is brought into contact with surface of the second member, facing to the unit; second extended sections that extends along respective side surfaces of the second member, opposite to each other, from the second contact section; and projected second locking sections formed in the respective second extended sections to be engaged with the respective first locking sections,
wherein the guide member regulates movement of the first and second members in a direction in which the first and second members are separated from each other by engaging the respective first locking sections and the respective second locking sections.

3. The lifting device according to claim 1, wherein each of the plurality of units includes a unit body that applies processing to the substrate, and a base member on which the unit body is loaded, and the lifting device is provided between the base member and the installation surface.

4. A lifting device comprising:
a lifting mechanism that is provided between at least one of a plurality of units of a substrate processing apparatus and a floor surface on which the substrate processing apparatus is installed, and that adjusts height of the at least one unit with respect to the floor surface;
an adjustment member that is provided with an extended section extended from the lifting mechanism, and that is capable of operating the lifting mechanism through the extended section; and
a plate for supporting a lower surface of the at least one unit, wherein the lifting mechanism is provided between the floor surface and the plate so as to be able to adjust height of the at least one unit with respect to the floor surface, and the adjustment member includes the extended section extended from the lifting mechanism along the plate to be able to operate the lifting mechanism through the extended section,
wherein the lifting mechanism includes: first and second members that are stacked between the floor surface and the plate, and each of which has a surface facing to each other so as not to be horizontal; and a third member provided between the first and second members so as to be wedge-shaped, and the height adjuster is capable of adjusting a distance between the first and second members by driving the third member to be slid.

5. The lifting device according to claim 4, further comprising a height adjuster provided in the lifting mechanism, wherein the adjustment member includes: a connection section to which the height adjuster is connected; the extended section that extends from the connection section along the plate; and an operation section provided in the extended section, so that the lifting mechanism can be operated through the height adjuster by operating the operation section.

6. The lifting device according to claim 4, wherein the lifting mechanism is provided on the floor surface side in one end of the plate,
the lifting device further comprising a height adjuster capable of adjusting height of the at least one unit with respect to the floor surface, the height adjuster being provided on the floor surface side in the other end of the plate, wherein the extended section extends from the connection section in a direction of the height adjuster.

7. The lifting device according to claim 4, wherein the lifting device is a fixture that lifts the at least one unit when the at least one unit is conveyed by using a dolly.

8. A substrate processing apparatus comprising:
the lifting device according to claim 1; and
a unit provided on the lifting device, whose height with respect to an installation surface is adjusted by the lifting device.

9. The substrate processing apparatus according to claim 8, wherein the substrate processing apparatus includes a plurality of assembled units, and a plurality of the lifting devices is provided for each of the plurality of units.

10. A substrate processing apparatus comprising:
the lifting device according to claim 4; and
a unit provided on the lifting device, whose height with respect to a floor surface is adjusted by the lifting device.

11. The substrate processing apparatus according to claim 10, wherein the substrate processing apparatus includes a plurality of assembled units, and a plurality of the lifting devices is provided for each of the plurality of units.

12. A method of conveying a unit, comprising the steps of:
lifting at least one unit of a substrate processing apparatus formed by assembling a plurality of units by using the lifting device according to claim 1;
inserting a dolly into a bottom space of the at least one unit after the step of lifting;
lowering the at least one unit until the at least one unit is loaded on the dolly by using the lifting device of claim 1 after the step of inserting; and
extracting and conveying the at least one unit loaded on the dolly by using the dolly.

* * * * *